(12) United States Patent
Li et al.

(10) Patent No.: US 12,016,232 B2
(45) Date of Patent: Jun. 18, 2024

(54) DISPLAY SUBSTRATE AND PREPARATION METHOD THEREOF, AND DISPLAY APPARATUS

(71) Applicant: BOE Technology Group Co., Ltd., Beijing (CN)

(72) Inventors: Yunlong Li, Beijing (CN); Dongsheng Li, Beijing (CN); Pengcheng Lu, Beijing (CN); Yuanlan Tian, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 695 days.

(21) Appl. No.: 17/258,740

(22) PCT Filed: Mar. 27, 2020

(86) PCT No.: PCT/CN2020/081854
§ 371 (c)(1),
(2) Date: Jan. 7, 2021

(87) PCT Pub. No.: WO2021/189482
PCT Pub. Date: Sep. 30, 2021

(65) Prior Publication Data
US 2022/0223652 A1 Jul. 14, 2022

(51) Int. Cl.
*H10K 59/38* (2023.01)
*H10K 50/818* (2023.01)
(Continued)

(52) U.S. Cl.
CPC ........... *H10K 59/38* (2023.02); *H10K 50/818* (2023.02); *H10K 59/12* (2023.02); *H10K 71/00* (2023.02);
(Continued)

(58) Field of Classification Search
CPC .... H10K 59/38; H10K 59/12; H10K 59/1201; H10K 77/10; H10K 71/00; H10K 50/818
(Continued)

(56) References Cited

U.S. PATENT DOCUMENTS

| 2015/0102376 A1 | 4/2015 | Toya et al. |
| 2016/0216552 A1 | 7/2016 | Jin |

(Continued)

FOREIGN PATENT DOCUMENTS

| CN | 104582053 A | 4/2015 |
| CN | 107256879 A | 10/2017 |
| CN | 108878687 A | 11/2018 |

OTHER PUBLICATIONS

European Search Report for 20904240.7 dated Mar. 22, 2023.

*Primary Examiner* — Tu-Tu V Ho
(74) *Attorney, Agent, or Firm* — Ling Wu; Stephen Yang; Ling and Yang Intellectual Property

(57) ABSTRACT

Provided is a display substrate, including: a base substrate, a light emitting structure layer disposed on the base substrate, and a color filter layer disposed on the light emitting structure layer; the base substrate having a display area and a peripheral area located at a periphery of the display area, the display area including multiple pixel driving circuits connected with the light emitting structure layer in the display area, the pixel driving circuit including a transistor which includes an active layer located in an interior of the base substrate; the color filter layer including a transition structure, the transition structure of the color filter layer being located between the display area and the peripheral area of the base substrate.

18 Claims, 14 Drawing Sheets

(51) Int. Cl.
*H10K 59/12* (2023.01)
*H10K 71/00* (2023.01)
*H10K 77/10* (2023.01)

(52) U.S. Cl.
CPC ......... *H10K 77/10* (2023.02); *H10K 59/1201* (2023.02)

(58) Field of Classification Search
USPC .......................................................... 257/40
See application file for complete search history.

(56) References Cited

U.S. PATENT DOCUMENTS

| | | |
|---|---|---|
| 2018/0061896 A1 | 3/2018 | Cheng et al. |
| 2018/0145113 A1 | 5/2018 | Sakairi |
| 2020/0091247 A1* | 3/2020 | Lee .................. H10K 59/38 |

* cited by examiner

DISPLAY SUBSTRATE AND PREPARATION METHOD THEREOF, AND DISPLAY APPARATUS

CROSS-REFERENCE TO RELATED APPLICATION

The present application is a U.S. National Phase Entry of International Application No. PCT/CN2020/081854 having an international filing date of Mar. 27, 2020. The above-identified application is incorporated into this application by reference in their entirety.

TECHNICAL FIELD

The present disclosure relates to, but is not limited to, the field of display technology, in particular to a display substrate and a preparation method thereof, and a display apparatus.

BACKGROUND

Micro Organic Light-emitting Diodes (Micro-OLEDs) are micro-displays that have been developed in recent years, and silicon-based OLEDs are one kind of them. A silicon-based OLED can not only enable active addressing of pixels, but also enable the preparation of various functional circuits, including a Timing Control (TCON) circuit, an Over Current Protection (OCP) circuit, or the like, on a silicon-based underlay substrate. This is conducive to reducing the system volume and realizing light weight. A silicon-based OLED is prepared by the mature Complementary Metal Oxide Semiconductor (CMOS) integrated circuit technology, has the advantages of small volume, high resolution (PPI), high refresh rate, etc., and is widely used in the near-eye display field of Virtual Reality (VR) or Augmented Reality (AR).

SUMMARY

The following is a summary of the subject matter described in detail herein. This summary is not intended to limit the protection scope of the claims.

The present disclosure provides a display substrate and a preparation method thereof, and a display apparatus.

In one aspect, the present disclosure provides a display substrate, including: a base substrate, a light emitting structure layer disposed on the base substrate, and a color filter layer disposed on the light emitting structure layer; the base substrate has a display area and a peripheral area located at a periphery of the display area, the display area includes multiple pixel driving circuits connected with the light emitting structure layer in the display area, and the pixel driving circuit includes a transistor which includes an active layer located in an interior of the base substrate; the color filter layer includes a transition structure, the transition structure of the color filter layer is located between the display area and the peripheral area of the base substrate, the transition structure includes at least one color filter unit, a thickness of the at least one color filter unit decreases in a direction from the peripheral area to the display area, and an overlapping area between an orthographic projection of the transition structure of the color filter layer on the base substrate and the display area of the base substrate is not greater than 5% of the display area.

In another aspect, the present disclosure provides a display apparatus, including the display substrate described above.

In a further aspect, the present disclosure provides a method for preparing a display substrate, including: forming a light emitting structure layer on a base substrate, wherein the base substrate has a display area and a peripheral area located at a periphery of the display area, the display area includes multiple pixel driving circuits connected with the light emitting structure layer in the display area, and the pixel driving circuit includes a transistor which includes an active layer located in an interior of the base substrate; forming a color filter layer on the light emitting structure layer, wherein the color filter layer includes a transition structure, the transition structure of the color filter layer is located between the display area and the peripheral area of the base substrate, the transition structure includes at least one color filter unit, a thickness of the at least one color filter unit decreases in a direction from the peripheral area to the display area, and an overlapping area between an orthographic projection of the transition structure of the color filter layer on the base substrate and the display area of the base substrate is not greater than 5% of the display area.

Other aspects will become apparent upon reading and understanding accompanying drawings and the detailed description.

BRIEF DESCRIPTION OF DRAWINGS

Accompanying drawings are used to provide an understanding of technical solutions of the present disclosure and form a part of the specification. Together with embodiments of the present disclosure, they are used to explain technical solutions of the present disclosure and do not constitute a limitation on the technical solutions of the present disclosure.

DETAILED DESCRIPTION

Figure 1:
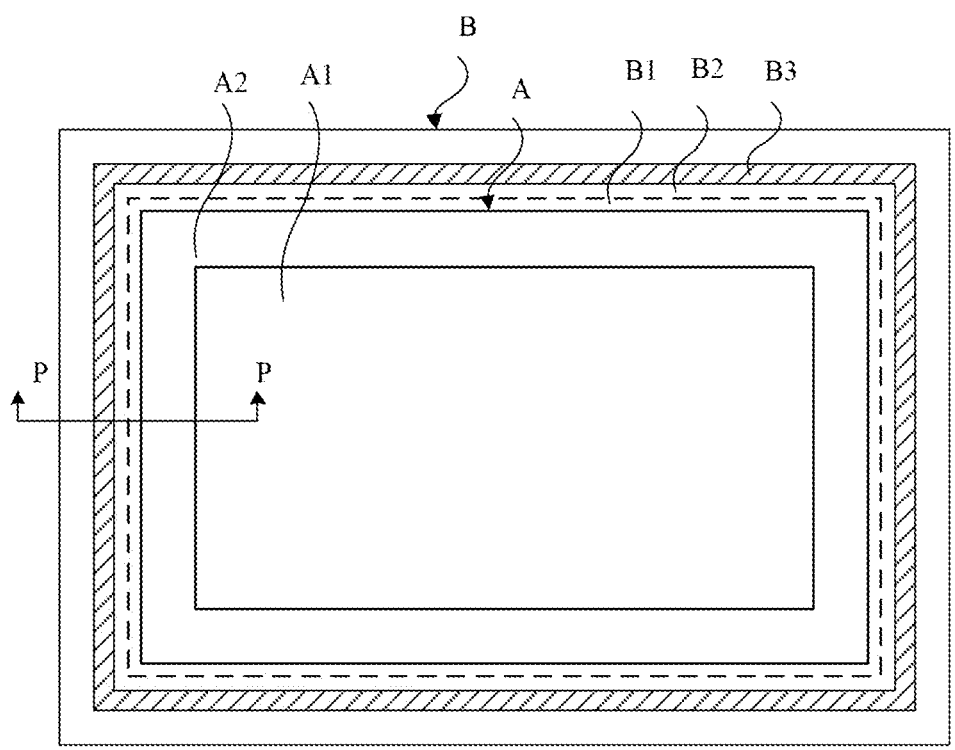
FIG. 1 is a schematic plan view of a display substrate according to at least one embodiment of the present disclosure.

Multiple embodiments are described in the present disclosure, but the description is exemplary rather than limiting, and what is obvious for those of ordinary skills in the art is that there may be more embodiments and implementation solutions within the scope of the embodiments described in the present disclosure. Although many possible combinations of features are shown in the drawings and discussed in the Detailed Description, many other combinations of the disclosed features are also possible. Unless specifically limited, any feature or element of any embodiment may be used in combination with or in place of any other feature or element of any other embodiment.

The present disclosure includes and contemplates combinations with features and elements known to those of ordinary skills in the art. Embodiments, features and elements already disclosed in the present disclosure may also be combined with any conventional features or elements to form a unique solution defined by the claims. Any feature or element of any embodiment may also be combined with features or elements from other solutions to form another unique solution defined by the claims. Therefore, it should be understood that any of the features shown and discussed in the present disclosure may be implemented individually or in any suitable combination. Therefore, the embodiments are not otherwise limited except in accordance with the appended claims and equivalents thereof. In addition, one or more modifications and changes can be made within the protection scope of the appended claims.

Furthermore, in describing representative embodiments, the specification may have presented a method or process as a specific sequence of steps. However, to the extent that the method or process does not depend on the specific order of steps described herein, the method or process should not be limited to the specific order of steps described. As those of ordinary skills in the art will understand, other sequences of steps are also possible. Therefore, the specific order of steps set forth in the specification should not be interpreted as limiting the claims. Furthermore, the claims for the method or process should not be limited to performing their steps in the written orders, and those skilled in the art can easily understand that these orders can be varied and still remain within the spirit and scope of the embodiments of the present disclosure.

In the drawings, the size of a constituent element, or the thickness or area of a layer, is sometimes exaggerated for clarity. Therefore, an embodiment of the present disclosure is not necessarily limited to the size, and the shape and dimension of each component in the drawings do not reflect real proportions. In addition, the drawings schematically show ideal examples, and an embodiment of the present disclosure is not limited to the shapes or values shown in the drawings.

Unless otherwise defined, technical terms or scientific terms used in the present disclosure have ordinary meanings understood by those of ordinary skills in the field to which the present disclosure pertains. The words "first", "second" and the like used in the present disclosure do not indicate any order, quantity or importance, but are only used to distinguish different components. In the present disclosure, "multiple" may indicate the number of two or more. Similar words such as "including" or "containing" mean that elements or articles appearing before the word cover elements or articles listed after the word and their equivalents, without excluding other elements or articles. Similar terms such as "couple", "connect" or "link" are not limited to physical or mechanical connections, but may include electrical connections, whether direct or indirect. "Electrical connection" includes a case where the constituent elements are connected together by an element having a certain electrical function. The "element having a certain electrical function" is not particularly limited as long as it can transmit and receive electrical signals between connected constituent elements. Examples of the "element having a certain electrical function" not only include electrodes and wirings, but also include switching elements such as transistors, resistors, inductors, capacitors, and other elements with one or more functions.

In the present disclosure, a transistor refers to an element including at least three terminals, namely a gate electrode, a drain electrode and a source electrode. The transistor has a channel area between the drain electrode (a drain electrode terminal, a drain area or a drain electrode) and the source electrode (a source electrode terminal, a source area or a source electrode), and current can flow through the drain electrode, the channel area and the source electrode. In the present disclosure, the channel area refers to an area through which current mainly flows.

In the present disclosure, it may be the case that the first pole is a drain electrode and the second pole is a source electrode, and it may also be the case that the first pole is a source electrode and the second pole is a drain electrode. In a case where transistors with opposite polarities are used or the direction of current changes during circuit operation, the functions of "source electrode" and "drain electrode" are sometimes interchanged. Therefore, in the present disclosure, "source electrode" and "drain electrode" may be interchanged.

In the present disclosure, "parallel" refers to a state in which an angle formed by two straight lines is −10 degrees or more and 10 degrees or less, and thus also includes a state in which the angle is −5 degrees or more and 5 degrees or less. In addition, "vertical" refers to a state in which an angle formed by two straight lines is 80 degrees or more and 100 degrees or less, and thus also includes a state in which the angle is 85 degrees or more and 95 degrees or less.

In the present disclosure, "film" and "layer" can be interchanged. For example, "conductive layer" can sometimes be replaced by "conductive film". Similarly, "insulating film" can sometimes be replaced by "insulating layer".

In order to keep the following description of the embodiments of the present disclosure clear and concise, detailed descriptions of some known functions and known components are omitted from the present disclosure. The accompanying drawings of the embodiments of the present disclosure only refer to structures involved in the embodiments of the present disclosure, and as to other structures, reference may be made to general designs.

An embodiment of the present disclosure provides a display substrate, including: a base substrate, a light emitting structure layer disposed on the base substrate, and a color filter layer disposed on the light emitting structure layer. The base substrate has a display area and a peripheral area located at a periphery of the display area. The display area includes multiple pixel driving circuits connected with the light emitting structure layer in the display area, the pixel driving circuit including a transistor which includes an active layer located in an interior of the base substrate. The color filter layer includes a transition structure. The transition structure of the color filter layer is located between the display area and the peripheral area of the base substrate, the transition structure includes at least one color filter unit, a thickness of the at least one color filter unit decreases in a direction from the peripheral area to the display area, and an overlapping area between an orthographic projection of the transition structure of the color filter layer on the base substrate and the display area of the base substrate is not greater than 5% of the display area.

In some examples, the transition structure of the color filter layer may include multiple color filter units arranged periodically, and a thickness of one of the color filter units decreases in a direction from the peripheral area to the display area. In some examples, the transition structure of the color filter layer only includes one color filter unit, and a thickness of the color filter unit decreases in the direction from the peripheral area to the display area.

In some examples, the active layer of the transistor is located in the interior of the base substrate; in other words, the active layer of the transistor is integrated in the base substrate. Connection electrodes of a source electrode, a drain electrode and a gate electrode of the transistor may be exposed on a surface of the base substrate. For example, the base substrate may be a silicon-based underlay substrate. The silicon-based underlay substrate is also called an IC wafer, on which a pixel driving circuit for generating a driving signal, a gate driving circuit for generating a gate driving signal and a data driving circuit for generating a data signal may be integrated.

In some examples, the base substrate may have a display area and a peripheral area located at a periphery of the display area. The display area of the base substrate extends outward in a direction away from a center to form the peripheral area. In other words, the display area and the peripheral area of the base substrate are continuous. For example, the display area may be a rectangular area, and the peripheral area may be a rectangular ring area surrounding the display area.

In some examples, the color filter layer may have a first area, a transition area located at a periphery of the first area, and a second area located at a periphery of the transition area. The transition area and the second area sequentially surround the first area, the first area extends outward in the direction away from the center to form the transition area, and the transition area extends outward in the direction away from the center to form the second area. In other words, the first area, the transition area and the second area are continuous. The transition structure of the color filter layer is located in the transition area of the color filter layer.

In some examples, the first area of the color filter layer can completely overlap with the display area of the base substrate, and the transition area and the second area of the color filter layer can overlap with the peripheral area of the base substrate, then there is no overlapping area between the transition area of the color filter layer and the display area of the base substrate, i.e., there is no overlapping area between an orthographic projection of the transition structure on the base substrate and the display area. In this example, the proportion of the overlapping area between the orthographic projection of the transition structure of the color filter layer on the base substrate and the display area in the display area may be 0.

In some examples, the first area and the transition area of the color filter layer can completely overlap with the display area of the base substrate, and the second area of the color filter layer can overlap with the peripheral area of the base substrate, then an overlapping area between the transition area of the color filter layer and the display area of the base substrate is the transition area of the color filter layer, that is, the orthographic projection of the transition structure on the base substrate is located in the display area.

In some examples, the first area of the color filter layer can completely overlap with the display area of the base substrate, the second area of the color filter layer can completely overlap with the peripheral area of the base substrate, and the transition area of the color filter layer can partially overlap with the display area of the base substrate and partially overlap with the peripheral area of the base substrate, that is, a part of the orthographic projection of the transition structure of the color filter layer on the base substrate can be located in the display area, while the other part thereof can be located in the peripheral area.

In some examples, in a direction from the peripheral area to the center of the display area, a ratio of a dimension of the overlapping area between the transition structure of the color filter layer and the display area to a dimension of the display area can be less than 5%, for example, the ratio may range from 1% to 3%. The display area can be rectangular, rounded rectangular, circular, etc., which is not limited in the present disclosure.

In some examples, taking a rectangular display area as an example, multiple pixels are regularly arranged in the display area, and the display area can be divided into two bilaterally symmetrical areas (for example, a first display area and a second display area) along a first axis of symmetry passing through the center of the display area. Taking the first display area on the left side of the first axis of symmetry as an example, in the direction from the peripheral area to the center of the display area, which direction is perpendicular to the first axis of symmetry, a ratio of a width of an overlapping area between the transition area of the color filter layer and the first display area to a width of the display area can be less than 5%. For example, in the direction from the peripheral area to the center of the display area, which direction is perpendicular to the first axis of symmetry, 32 pixels are arranged in one row in the overlapping area between the transition area of the color filter layer and the first display area, and 1920 pixels are arranged in one row in the display area, then the proportion of the overlapping area in the display area is about 1.67%.

In some examples, multiple pixels are regularly arranged in a rectangular display area, and the display area can be divided into two vertically symmetrical areas (for example, a third display area and a fourth display area) along a second axis of symmetry passing through the center of the display area. Taking the third display area on the upper side of the axis of symmetry as an example, in the direction from the peripheral area to the center of the display area, which direction is perpendicular to the second axis of symmetry, a ratio of a width of an overlapping area between the transition area of the color filter layer and the third display area to a width of the display area can be less than 5%. For example, in the direction from the peripheral area to the center of the display area, which direction is perpendicular to the second axis of symmetry, 32 pixels are arranged in one column in the overlapping area between the transition area of the color filter layer and the third display area, and 1800 pixels are arranged in one column in the display area, then the proportion of the overlapping area in the display area is about 1.78%.

In some examples, a ratio of an area of the overlapping area between the orthographic projection of the transition structure of the color filter layer on the base substrate and the display area to an area of the display area may be less than 5%. Taking the case as an example where the display area of the base substrate is rectangular and the transition area is a rectangular ring area having the same center as the display area, when the overlapping area between the transition area and the display area is the rectangular ring area having the same center as the display area, an area ratio of the overlapping area to the display area can be less than 5%, for example, the ratio ranges from 3% to 4%, which, however, is not limited in the present disclosure.

In the present disclosure, "thickness" refers to a height of a surface away from the base substrate to the surface of the base substrate in a direction of a plane perpendicular to the base substrate.

The display substrate according to at least one embodiment of the present disclosure can be a silicon-based OLED display substrate, which can be applied to a virtual reality device or an augmented reality device, or can be other types of display substrates, which is not limited in the embodiments of the present disclosure.

In at least one exemplary embodiment, the color filter layer in the display area and the transition structure may include: a first color filter unit, a second color filter unit and a third color filter unit which are arranged periodically, and color filter units in each period are arranged in an order of the first color filter unit, the second color filter unit and the third color filter unit in the direction from the peripheral area to the display area. There may be an overlapping area between the orthographic projection of the transition structure of the color filter layer on the base substrate and the display area. In the transition structure, the first color filter unit in each period has a slope having a thickness decreasing in the direction from the peripheral area to the display area, and thicknesses of first color filter units in multiple continuous periods in the direction from the peripheral area to the display area decrease continuously.

In some examples, in the transition structure, an average thickness of the first color filter units in multiple continuous periods in the direction from the peripheral area to the display area decreases continuously. In some examples, in the transition structure, thicknesses of slopes of the first color filter units in multiple continuous periods in the direction from the peripheral area to the display area decrease continuously. For example, in the transition structure, the minimum thickness of the slope of the first color filter unit in one period may be greater than the maximum thickness of the slope of the first color filter unit in an adjacent period in the direction from the peripheral area to the display area. In addition, the arrangement order of multiple color filter units in each period is not limited in the embodiments of the present disclosure. For example, color filter units in each period may be arranged in an order of the first color filter unit, the third color filter unit and the second color filter unit in the direction from the peripheral area to the display area. In addition, in some examples, dimensions of multiple color filter units may be the same. However, this is not limited in the present disclosure. For example, when multiple color filter units include a blue unit, a green unit and a red unit, the dimension of the blue unit may be greater than the dimension of the red unit, and the dimension of the red unit may be greater than the dimension of the green unit; or the dimension of the blue unit may be greater than the dimension of the green unit, and the dimension of the green unit may be equal to the dimension of the red unit.

In at least one exemplary embodiment, in the transition structure, an area corresponding to the first color filter unit in each period includes a suspension area, and the suspension area has a slope having a thickness decreasing in the direction from the peripheral area to the display area. The suspension area can be, for example, a cavity located between the first color filter unit and the base substrate, and an interior of the cavity can be filled with air. The slope of the suspension area is at least located at an interface of the cavity in contact with and close to the first color filter unit. In some examples, the suspension area is in a plane parallel to the base substrate, and the dimension of the suspension area in the direction from the peripheral area to the display area is not greater than the dimension of the first color filter unit in this direction. In some examples, the dimension of the suspension area in the direction from the peripheral area to the display area is not greater than the dimension of the first color filter unit in this direction, the suspension area is in a plane parallel to the base substrate, and side walls of both sides of the cavity in the direction from the peripheral area to the display area respectively include a side wall of a boundary of a stack structure of the first color filter unit, the second color filter unit and the third color filter unit in the peripheral area and a side wall of the second color filter unit or the third color filter unit in the transition area directly adjacent to the first color filter unit. In some examples, the dimension of the suspension area in the direction from the peripheral area to the display area is not greater than the dimension of the first color filter unit in this direction, the suspension area is in a plane parallel to the base substrate, and side walls of both sides of the cavity in the direction from the peripheral area to the display area respectively include side walls of the second color filter unit and the third color filter unit in the transition area directly adjacent to the first color filter unit.

In at least one exemplary embodiment, the color filter layer in the display area includes: a first color filter unit, a second color filter unit and a third color filter unit which are arranged periodically, and color filter units in each period are arranged in an order of the first color filter unit, the second color filter unit and the third color filter unit in the direction from the peripheral area to the display area. There is no overlapping area between the orthographic projection of the transition structure on the base substrate and the display area; and the transition structure includes a first color filter unit, and a thickness of the first color filter unit decreases in the direction from the peripheral area to the display area. For example, the first color filter unit may be a blue unit only allowing blue light to pass through, the second color filter unit may be a red unit only allowing red light to pass through, and the third color filter unit may be a green unit only allowing green light to pass through. The arrangement order of multiple color filter units in each period is not limited in the embodiments of the present disclosure. For example, color filter units in each period may be arranged in an order of the first color filter unit, the third color filter unit and the second color filter unit in the direction from the peripheral area to the display area. In addition, in some examples, dimensions of multiple color filter units may be the same. However, this is not limited in the present disclosure. For example, when multiple color filter units include a blue unit, a green unit and a red unit, the dimension of the blue unit may be greater than the dimension of the red unit, and the dimension of the red unit may be greater than the dimension of the green unit; or the dimension of the blue unit may be greater than the dimension of the green unit, and the dimension of the green unit may be equal to the dimension of the red unit.

In some examples, the thickness of the first color filter unit of the transition structure may be substantially equal to the thickness of the first color filter unit, the second color filter unit and the third color filter unit in the display area. For example, the thickness of a single-layer color filter unit may be 1 to 2 um.

In at least one exemplary embodiment, when there is an overlapping area between the orthographic projection of the transition structure on the base substrate and the display area, a ratio of an average thickness of the color filter layer in the overlapping area to an average thickness of the color filter layer in the display area other than the overlapping area ranges from 0.8 to 1.5 times; and when there is no overlapping area between the orthographic projection of the transition structure on the base substrate and the display area, a ratio of an average thickness of the color filter layer in the transition structure close to the display area to an average thickness of the color filter layer in the display area ranges from 0.8 to 1.5 times. Alternatively, a thickness of the color filter layer at a junction between the transition structure and the display area is 0.8 to 1.5 times a thickness of a single-layer color filter unit. In some examples, the thickness of the color filter layer in the transition structure close to the display area may be substantially equal to the thickness of the color filter layer in the display area. In some examples, the thickness of a single-layer color filter unit may be 1 to 2 um. In the present disclosure, "substantially equal" means being equal under the condition that slight differences which may exist due to factors such as manufacturing processes are ignored.

In at least one exemplary embodiment, an array structure layer is disposed between the base substrate in the display area and the light emitting structure layer. The array structure layer in the display area includes: a first insulating layer disposed on the base substrate, a reflective electrode disposed on the first insulating layer and a second insulating layer covering the reflective electrode. The transistor of the pixel driving circuit includes a driving transistor. The first insulating layer is provided with a first via exposing a driving transistor of the base substrate, a first conductive pillar is disposed in the first via, and the reflective electrode is connected with the driving transistor through the first conductive pillar. The second insulating layer is provided with a second via exposing the reflective electrode, and a second conductive pillar connected with the reflective electrode is disposed in the second via. The light emitting structure layer in the display area includes: a first electrode disposed on the second insulating layer, an organic light emitting layer connected with the first electrode and a second electrode connected with the organic light emitting layer, and the first electrode is connected with the reflective electrode through the second conductive pillar. The first electrode may be an anode and the second electrode may be a cathode. The orthographic projection of the anode on the base substrate at least partially overlaps with the orthographic projection of the organic light emitting layer on the base substrate. The anode may be in direct contact with the organic light emitting layer, for example, the organic light emitting layer is directly formed on the anode. The cathode may be a planar structure and directly covers the organic light emitting layer.

In at least one exemplary embodiment, there is no overlapping area between the orthographic projection of the transition structure of the color filter layer on the base substrate and the peripheral area. The peripheral area may include: a first non-display area located at the periphery of the display area. An array structure layer is disposed between the base substrate in the first non-display area and the light emitting structure layer. The array structure layer in the first non-display area includes: a first insulating layer disposed on the base substrate and a second insulating layer disposed on the first insulating layer. The light emitting structure layer in the first non-display area includes: a first electrode disposed on the second insulating layer, an organic light emitting layer connected with the first electrode, and a second electrode connected with the organic light emitting layer. The first electrode may be an anode and the second electrode may be a cathode. The color filter layer in the first non-display area includes: multiple color filter units that are stacked, and a thickness of the color filter layer in the first non-display area is greater than a thickness of the transition structure. For example, the average thickness of the color filter layer in the first non-display area may be greater than the average thickness of the transition structure.

In the present disclosure, when there is a difference in thickness of the color filter layer in a certain area due to overlapping of the boundaries of the color filter units, the thickness of the color filter layer in this area can be the average thickness of the color filter layer in this area. When there is a difference in the thickness of the transition structure due to overlapping of the boundaries of the color filter units, the thickness of the transition structure can be the average thickness of the transition structure.

In at least one exemplary embodiment, the peripheral area may include: a first non-display area located at the periphery of the display area. There is an overlapping area between the orthographic projection of the transition structure on the base substrate and the first non-display area. An array structure layer is disposed between the base substrate in the first non-display area and the light emitting structure layer. The array structure layer in the first non-display area includes: a first insulating layer disposed on the base substrate and a second insulating layer disposed on the first insulating layer. The light emitting structure layer in the first non-display area includes: a first electrode disposed on the second insulating layer, an organic light emitting layer connected with the first electrode, and a second electrode connected with the organic light emitting layer. The first electrode may be an anode and the second electrode may be a cathode.

In at least one exemplary embodiment, the peripheral area may include: a first non-display area located at the periphery of the display area and a second non-display area located at a periphery of the first non-display area, and a boundary of the organic light emitting layer of the light emitting structure layer in the first non-display area is located in the second non-display area. The color filter layer in the second non-display area includes multiple color filter units that are stacked, and a thickness of the color filter layer in the second non-display area is greater than a thickness of the color filter layer in the first non-display area. In some examples, the average thickness of the color filter layer in the second non-display area may be greater than the average thickness of the color filter layer in the first non-display area. In some examples, the thickness of the color filter layer in the second non-display area close to the first non-display area may be greater than the thickness of the color filter layer in the first non-display area close to the display area. In some examples, the color filter layer in the display area includes a first color filter unit, a second color filter unit and a third color filter unit which are arranged periodically, and the preparation order of the color filter layer in the display area is that the first color filter unit, the second color filter unit and the third color filter unit are formed sequentially, then the color filter layer in the second non-display area may include a first color filter unit, a second color filter unit, and a third color filter unit that are stacked. The stacking order of the color filter units in the color filter layer in the second non-display area is related to the preparation order of the color filter units. However, this is not limited in the present disclosure.

In an exemplary embodiment, the peripheral area includes: a first non-display area located at the periphery of the display area, a second non-display area located at a periphery of the first non-display area, and a third non-display area located at a periphery of the second non-display area. A boundary of the second electrode of the light emitting structure layer in the first non-display area is located in the third non-display area. The color filter layer in the third non-display area includes multiple color filter units that are stacked, and a thickness of the color filter layer in the third non-display area is greater than the thickness of the color filter layer in the first non-display area. The stacking order of the color filter units in the color filter layer in the third non-display area is related to the preparation order of the color filter units, This is not limited in the present disclosure.

Embodiments of the present disclosure and examples thereof will be described below with reference to the accompanying drawings. In the following examples, description is made by taking the case as an example where the base substrate is a silicon-based underlay substrate in which an active layer of a transistor is integrated.

Figure 2:
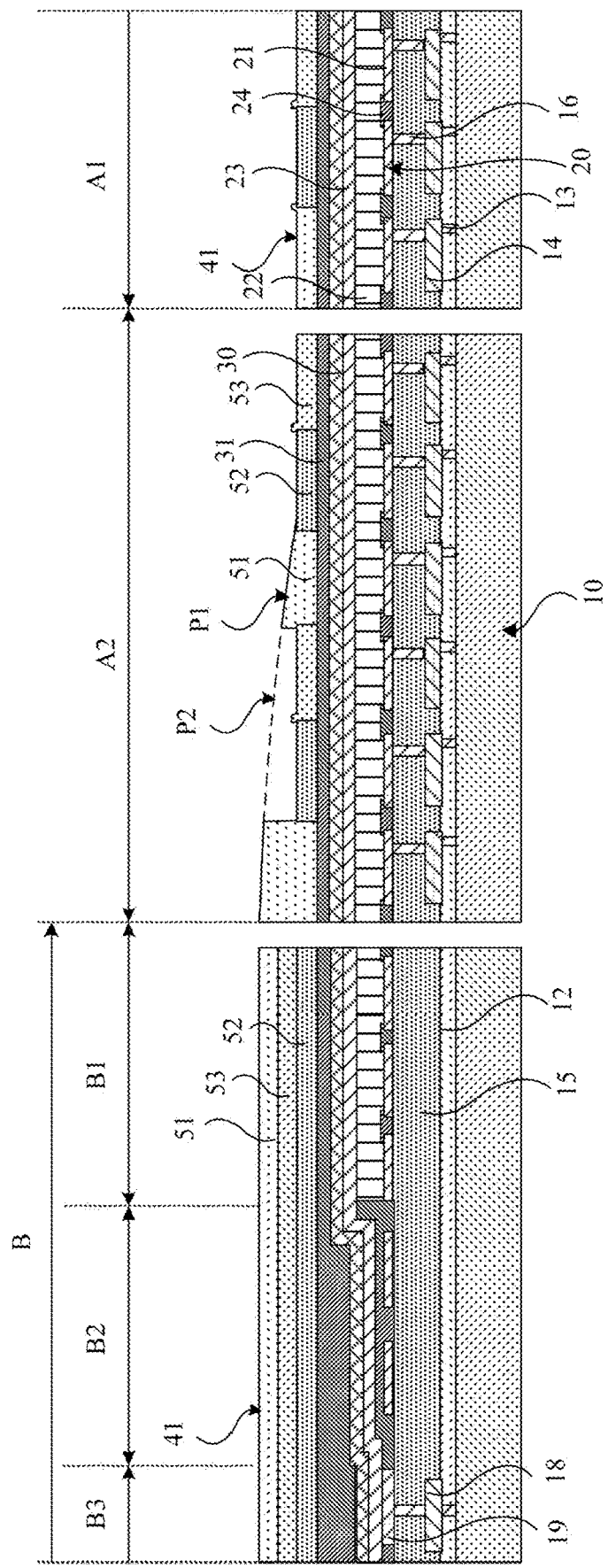
FIG. 2 is a schematic sectional view of the display substrate in FIG. 1 taken in a PP direction.

FIG. 1 is a schematic plan view of a display substrate according to at least one embodiment of the present disclosure. FIG. 2 is a schematic sectional view of the display substrate in FIG. 1 taken in a PP direction. As shown in FIGS. 1 and 2, on a plane parallel to the display substrate, the display substrate according to an embodiment of the present disclosure includes: a display area A and a peripheral area B located at the periphery of the display area A. The display area A includes a main display area A1 and an auxiliary display area A2 located at the periphery of the main display area A1. The peripheral area B includes: a first non-display area B1 located at the periphery of the auxiliary display area A2, a second non-display area B2 located at the periphery of the first non-display area B1, and a third non-display area B3 located at the periphery of the second non-display area B2. The main display area A1 is, for example, a rectangular area, and the auxiliary display area A2, the first non-display area B1, the second non-display area B2 and the third non-display area B3 sequentially surround the main display area A1. In this embodiment, description is made by taking the case as an example where the display area A is substantially a rectangle, and the display area A can also be a rounded rectangle, a circle, a rectangle with an opening, or other shapes, which is not limited.

In this exemplary embodiment, multiple display units arranged regularly are provided in the main display area A1 and the auxiliary display area A2. For example, three display units of different colors constitute one pixel. The three display units may be a red display unit, a green display unit and a blue display unit, respectively. In some possible implementations, one pixel may include two, four, five or more display units, which can be designed and determined according to the actual application environment, and is not limited here.

The display substrate according to this exemplary embodiment can be applied to a VR product. Taking VR glasses as an example, for the display substrate according to this exemplary embodiment, the influence of the optical alignment requirement on the main display area A1 when the display substrate is assembled with a product frame can be adjusted through the auxiliary display area A2, for example, by lighting up the auxiliary display area to compensate the opening accuracy of the whole optical machine. In some examples, the display units in the auxiliary display area A2 may be controlled separately relative to the display units in the main display area A1. For example, when the display substrate deviates to the left side relative to the product frame, part of the main display area A1 on the left side will be shielded by the product frame. At this time, it is feasible to compensate the opening accuracy of the whole optical machine by controlling to light up the display units in the auxiliary display area A2 on the right side. For example, when the display substrate deviates to the right side relative to the product frame, part of the main display area A1 on the right side will be shielded by the product frame. At this time, it is feasible to compensate the opening accuracy of the whole optical machine by controlling to light up the display units in the auxiliary display area A2 on the left side. However, this is not limited in the present disclosure. In actual use, the display units for display in the auxiliary display area can be controlled according to the deviation direction of assembly of the display substrate and the product frame.

In some examples, in the direction from the peripheral area B to the display area A, the width of the auxiliary display area A2 may be 0.05 to 0.15 mm, for example, about 0.1 mm. Since the dimension of one pixel is about 3 to 5 um, multiple display units can be arranged in the auxiliary display area A2. In the present disclosure, for the sake of simple illustration, only the structure of two pixels in the auxiliary display area A2 is shown in the drawings. However, this is not limited in the present disclosure.

In an embodiment of the present disclosure, the orthographic projection of the transition structure of the color filter layer on the base substrate may completely overlap with the auxiliary display area A2 of the base substrate. That is, the overlapping area between the orthographic projection of the transition area of the color filter layer on the base substrate and the display area A is the auxiliary display area A2. In some examples, the display area A is rectangular, and the auxiliary display area A2 has a rectangular ring shape with the same center as the display area A. In the direction from the peripheral area B to the center of the display area A, the width of the rectangular ring of the auxiliary display area A2 is, for example, 0.1 mm, and the width of the auxiliary display area A2 in this direction can account for less than 5%, for example, 1% to 2%, such as 1.6%, of the width of the entire display area A in this direction.

As shown in FIG. 2, on a plane perpendicular to the display substrate, the main display area A1 and the auxiliary display area A2 of the display substrate respectively include: a silicon-based underlay substrate 10, and an array structure layer (including multiple reflective electrodes 14), a light emitting structure layer 20, a first encapsulation layer 30, a first flat layer 31 and a color filter layer 41 that are stacked on the silicon-based underlay substrate 10. The silicon-based underlay substrate 10 is also called an IC wafer, on which a pixel driving circuit for generating a driving signal, a gate driving circuit for generating a gate driving signal and a data driving circuit for generating a data signal may be integrated. The array structure layer may include a first insulating layer 12 disposed on the silicon-based underlay substrate 10, reflective electrodes 14 disposed on the first insulating layer 12 and a second insulating layer 15 covering the reflective electrodes 14. The first insulating layer 12 is provided with a first via exposing the driving transistor of the silicon-based underlay substrate 10, a first conductive pillar 13 is disposed in the first via, and the reflective electrode 14 is connected with the driving transistor through the first conductive pillar 13. The second insulating layer 15 is provided with a second via exposing the reflective electrode 14, and a second conductive pillar 16 connected with the reflective electrode 14 is disposed in the second via. The light emitting structure layer 20 may include an anode layer (including multiple anodes 21) disposed on the second insulating layer 15, an organic light emitting layer 22 connected with the anodes 21 and a cathode layer (including a cathode 23) connected with the organic light emitting layer, and the anode 21 is connected with the reflective electrode 14 through the second conductive pillar 16. When multiple layers of metals, such as titanium (Ti)/Al/Ti/molybdenum (Mo), is used for the anode layer, the reflective electrode can form a conductive path between the pixel driving circuit and the anode. When the anode layer is made of materials including transparent metal oxides such as indium tin oxide (ITO) or indium zinc oxide (IZO) and has relatively high light transmittance, the reflective electrode can form a conductive channel between the pixel driving circuit and the anode on the one hand, and form a microcavity structure with the cathode layer on the other hand. This causes the light directly emitted by the organic light emitting layer and the light reflected by the reflective electrode to interfere with each other, thereby improving the color gamut of the emitted light and enhancing the brightness of the emitted light. The material of the cathode layer can be a metal, for example, the metal can be made of materials such as magnesium, a magnesium alloy, aluminum (Al) or an aluminum alloy, etc., for example, forming a transflective electrode.

Figure 3:
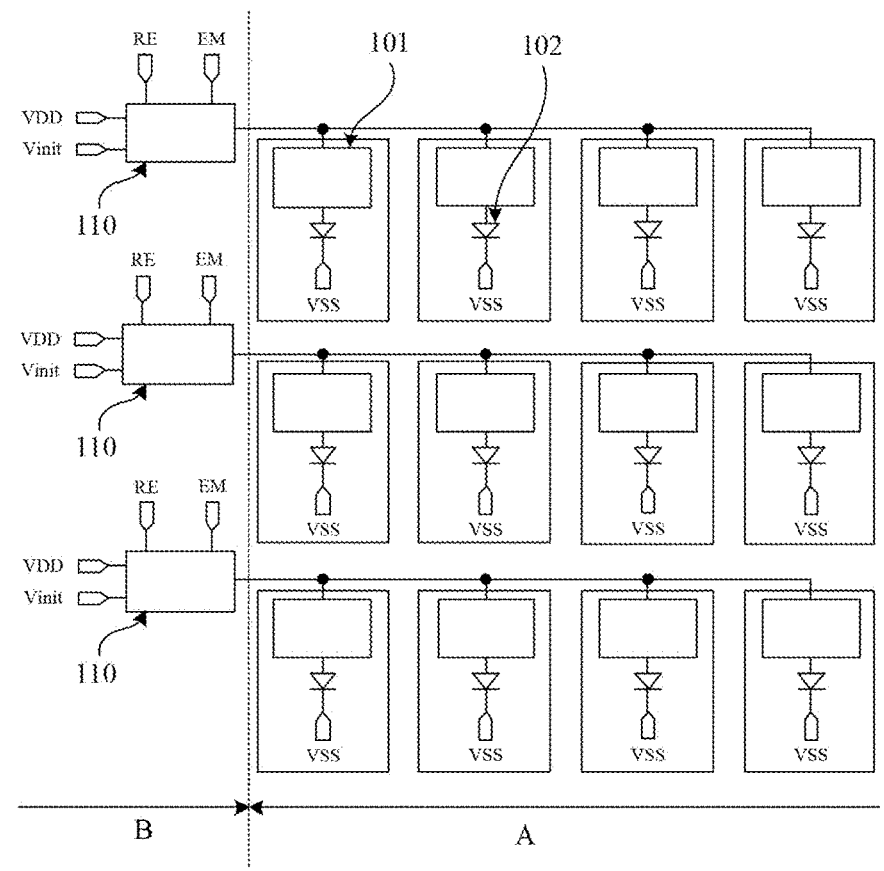
FIG. 3 is a schematic diagram of a circuit principle of a silicon-based underlay substrate according to at least one embodiment of the present disclosure.

FIG. 3 is a schematic diagram of a circuit principle of a silicon-based underlay substrate according to at least one embodiment of the present disclosure. The silicon-based underlay substrate 10 includes multiple display units in the main display area A1 and the auxiliary display area A2 and a control circuit in the peripheral area B. Multiple display units in the main display area A1 and the auxiliary display area A2 are regularly arranged to form multiple display rows and multiple display columns. Each display unit includes a pixel driving circuit 101 and a light emitting device 102 connected to the pixel driving circuit 101. The light emitting device 102 includes an anode, an organic light emitting layer and a cathode that are stacked. The pixel driving circuit 101 includes at least a driving transistor. The control circuit includes at least multiple voltage control circuits 110 each connected with multiple pixel driving circuits 101. For example, one voltage control circuit 110 is connected to the pixel driving circuits 101 in one display row, first poles of the driving transistors in pixel driving circuits 101 in this display row are collectively connected to this voltage control circuit 110, a second pole of each driving transistor is connected to an anode of the light emitting device 102 of the display unit in which the driving transistor is located, and the cathode of the light emitting device 102 is connected to an input end of a second power source signal VSS. The voltage control circuits 110 are respectively connected to an input end of a first power source signal VDD, an input end of an initialization signal Vinit, an input end of a reset control signal RE and an input end of a light emitting control signal EM. The voltage control circuit 110 is configured to output, in response to a reset control signal RE, an initialization signal Vinit to the first pole of the driving transistor to control a corresponding light emitting device 102 to reset. The voltage control circuit 110 is further configured to output, in response to a light emitting control signal EM, a first power source signal VDD to the first pole of the driving transistor to drive a light emitting device 102 to emit light. By collectively connecting the pixel driving circuits 101 in one display row to the voltage control circuit 110, the structure of each pixel driving circuit 101 in the display area A can be simplified, and the occupied area of the pixel driving circuits 101 in the display area A can be reduced, so that more pixel driving circuits 101 and light emitting devices 102 can be disposed in the display area A, thereby realizing high PPI display. Under the control of the reset control signal RE, the voltage control circuit 110 outputs an initialization signal Vinit to the first pole of the driving transistor to control the corresponding light emitting device 102 to reset, which can prevent the voltage applied to the light emitting device 102 during light emission of a frame from affecting light emission of a next frame, and can improve image retention.

In some possible implementations, one voltage control circuit 110 may be connected to the pixel driving circuits 101 in two adjacent display units in the same display row, or may be connected to the pixel driving circuits 101 in three or more display units in the same display row, which is not limited here.

For example, the pixel driving circuits of the display units in the auxiliary display area A2 and the pixel driving circuits of the display units in the main display area A1 can be controlled by different voltage control circuits, so as to realize different control over the display units in the auxiliary display area and the display units in the main display area, thereby achieving the purpose of auxiliary display.

Figure 4:
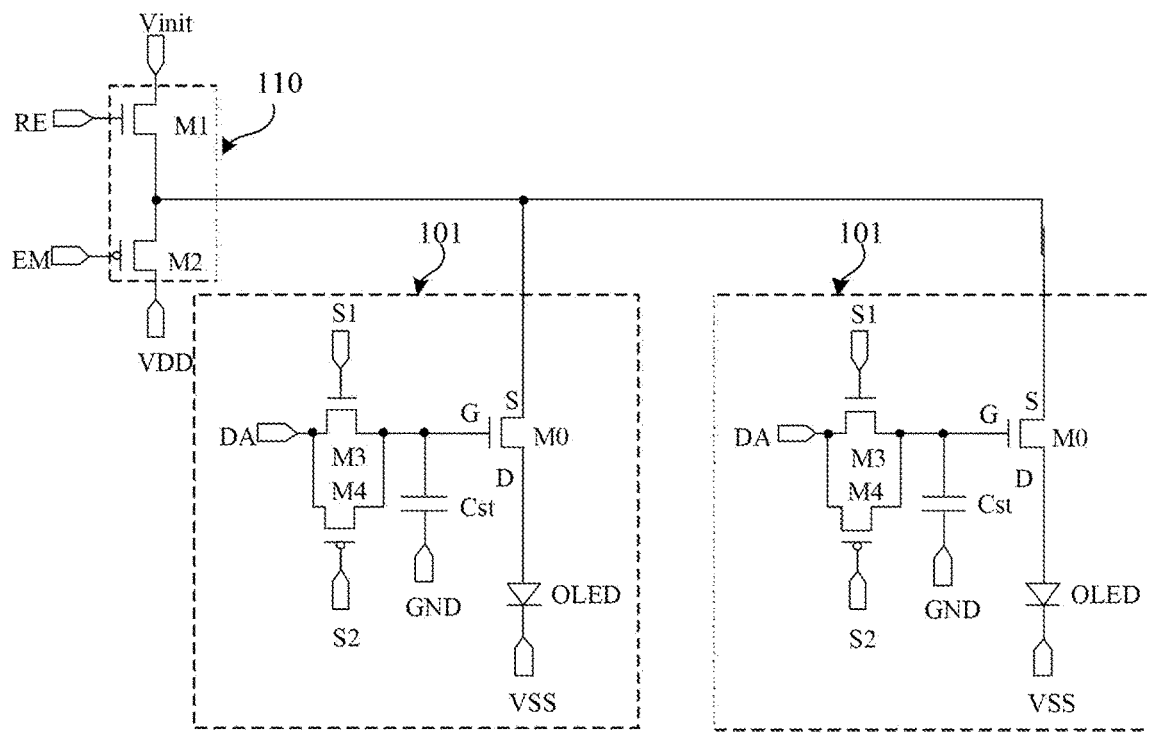
FIG. 4 is a schematic diagram of a circuit implementation of a voltage control circuit and a pixel driving circuit according to at least one embodiment of the present disclosure.

FIG. 4 is a schematic diagram of a circuit implementation of a voltage control circuit and a pixel driving circuit according to an embodiment of the present disclosure. As shown in FIG. 4, the light emitting device may include an OLED. An anode of the OLED is connected with a second pole D of a driving transistor M0, and a cathode of the OLED is connected with an input end of a second power source signal VSS. The voltage of the second power source signal VSS generally may be a negative voltage or a ground voltage $V_{GND}$ (generally 0 V). The voltage of the initialization signal Vinit may also be a ground voltage $V_{GND}$. In an exemplary embodiment, the OLED may be a Micro-OLED or a Mini-OLED, which is beneficial to the realization of high PPI display.

In an exemplary embodiment, the voltage control circuit 110 is connected with two pixel driving circuits 101 in one display row. The pixel driving circuit 101 includes a driving transistor M0, a third transistor M3, a fourth transistor M4 and a storage capacitor Cst, and the voltage control circuit 110 includes a first transistor M1 and a second transistor M2. The driving transistor M0, the first transistor M1, the second transistor M2, the third transistor M3 and the fourth transistor M4 are all Metal Oxide Semiconductor (MOS) field-effect transistors prepared in a silicon-based underlay substrate.

A control pole of the first transistor M1 is connected to the input end of the reset control signal RE and is configured to receive a reset control signal RE, a first pole of the first transistor M1 is connected to the input end of the initialization signal Vinit and is configured to receive an initialization signal Vinit, and a second pole of the first transistor M1 is connected to a first pole S of the corresponding driving transistor M0 and a second pole of the second transistor M2. A control pole of the second transistor M2 is connected to the input end of the light emitting control signal EM and is configured to receive a light emitting control signal EM, a first pole of the second transistor M2 is connected to the input end of the first power source signal VDD and is configured to receive a first power source signal VDD, and the second pole of the second transistor M2 is connected to the first pole S of the corresponding driving transistor M0 and the second pole of the first transistor M1. In an exemplary embodiment, the types of the first transistor M1 and the second transistor M2 may be different, for example, the first transistor M1 is an N-type transistor and the second transistor M2 is a P-type transistor, or the first transistor M1 is a P-type transistor and the second transistor M2 is an N-type transistor. In some possible implementations, the types of the first transistor M1 and the second transistor M2 may be the same, which can be designed and determined according to the actual application environment, and is not limited here.

The pixel driving circuit 101 includes a driving transistor M0, a third transistor M3, a fourth transistor M4 and a storage capacitor Cst. The control pole G of the driving transistor M0 and the first pole S of the driving transistor M0 are connected to the second pole of the first transistor M1 and the second pole of the second transistor M2, and the second pole D of the driving transistor M0 is connected to the anode of the OLED. The control pole of the third transistor M3 is connected to an input end of a first control pole scanning signal S1 and is configured to receive a first control pole scanning signal S1, the first pole of the third transistor M3 is connected to an input end of a data signal DA and is configured to receive a data signal DA, and the second pole of the third transistor M3 is connected to the control pole G of the driving transistor M0. The control pole of the fourth transistor M4 is connected to an input end of a second control pole scanning signal S2 and is configured to receive a second control pole scanning signal S2, the first pole of the fourth transistor M4 is connected to the input end of the data signal DA and is configured to receive a data signal DA, and the second pole of the fourth transistor M4 is connected to the control pole G of the driving transistor M0. A first end of the storage capacitor Cst is connected to the control pole G of the driving transistor M0, and a second end of the storage capacitor Cst is connected to the ground end GND. In an exemplary embodiment, the driving transistor M0 may be an N-type transistor, and the types of the third transistor M3 and the fourth transistor M4 may be different, for example, the third transistor M3 is an N-type transistor and the fourth transistor M4 is a P-type transistor. If the voltage of the data signal DA is a voltage corresponding to a high gray scale, the P-type fourth transistor M4 is turned on to transmit the data signal DA to the control pole G of the driving transistor M0, which can prevent the voltage of the data signal DA from being affected by, for example, a threshold voltage of the N-type third transistor M3. If the voltage of the data signal DA is a voltage corresponding to a low gray scale, the N-type third transistor M3 is turned on to transmit the data signal DA to the control pole G of the driving transistor M0, which can prevent the voltage of the data signal DA from being affected by a threshold voltage of the P-type fourth transistor M4. In this way, it is possible to increase a range of the voltage input to the control pole G of the driving transistor M0. In some possible implementations, the types of the third transistor M3 and the fourth transistor M4 may be that: the third transistor M3 is a P-type transistor and the fourth transistor M4 is an N-type transistor. In some possible implementations, the pixel driving circuit may be a 3T1C, 5T1C or 7T1C circuit structure, or may be a circuit structure with an internal compensation or external compensation function, which is not limited in the present disclosure.

As shown in FIG. 2, the color filter layer 41 in the main display area A1 and the auxiliary display area A2 may include multiple color filter units arranged periodically, for example, including a first color filter unit (e.g., a blue B unit) 51, a second color filter unit (e.g., a red R unit) 52, and a third color filter unit (e.g., a green G unit) 53. The color filter units in the main display area A1 and the auxiliary display area A2 are disposed on the first flat layer 31 and are disposed corresponding to the display units.

As shown in FIG. 2, in the main display area A1 and the auxiliary display area A2, color filter units in each period are arranged in an order of the first color filter unit 51, the second color filter unit 52 and the third color filter unit 53 in the direction from the peripheral area B to the display area A. In the auxiliary display area A2, in the direction from the peripheral area B to the display area A, the first color filter unit 51 in each period has a slope P1, and the thickness of the slope P1 decreases in the direction from the peripheral area B to the display area A. In other words, the thickness of the first color filter unit 51 in each period gradually decreases in the direction from the peripheral area B to the display area A. Furthermore, in the auxiliary display area A2, thicknesses of first color filter units 51 in multiple continuous periods decrease continuously in the direction from the peripheral area B to the display area A. FIG. 2 illustrates the first color filter units 51 in two continuous periods in the direction from the peripheral area B to the display area A in the auxiliary display area A2. As shown in FIG. 2, the minimum thickness of the slopes P1 of the first color filter units 51 close to the peripheral area B in two adjacent periods is greater than the maximum thickness of the slopes P1 of the first color filter units 51 away from the peripheral area B. In the auxiliary display area A2, in the direction from the peripheral area B to the display area A, the thicknesses of the first color filter units 51 in multiple continuous periods exhibit a continuously decreasing trend as a whole, as shown by the slope P2 indicated by the dotted line in FIG. 2. In some examples, the average thickness of the color filter layer 41 in the auxiliary display area A2 close to the main display area A1 may be substantially equal to the average thickness of the color filter layer 41 in the main display area A1. For example, the thickness of the color filter layer 41 at the junction between the auxiliary display area A2 and the main display area A1 may be substantially equal to the thickness of a single-layer color filter unit.

In some examples, the thicknesses of the first color filter unit, the second color filter unit and the third color filter unit in the main display area A1 and the second color filter unit and the third color filter unit in the auxiliary display area A2 are substantially equal.

As shown in FIG. 2, the first non-display area B1 may include an array structure layer disposed on the silicon-based underlay substrate 10, a light emitting structure layer 20 disposed on the array structure layer, a first encapsulation layer 30 disposed on the light emitting structure layer 20, a first flat layer 31 and a color filter layer 41. The array structure layer in the first non-display area B1 includes a first insulating layer 12 and a second insulating layer 15 stacked on the silicon-based underlay substrate 10. The light emitting structure layer 20 in the first non-display area B1 includes an anode 21, an organic light emitting layer 22 and a cathode 23 stacked on the second insulating layer 15. There is no electrical connection between the light emitting structure layer 20 in the first non-display area B1 and the pixel driving circuit of the silicon-based underlay substrate 10, so the light emitting structure layer 20 in the first non-display area B1 will not be lit. The first non-display area B1 may also be referred to as a Dummy Pixel area.

As shown in FIG. 2, the boundary of the organic light emitting layer 22 is located in the second non-display area B2. The second non-display area B2 may include an array structure layer disposed on the silicon-based underlay substrate 10, an anode 21 disposed on the array structure layer, a cathode 23 insulated from the anode 21 by a pixel definition layer 24, a first encapsulation layer 30 covering the cathode 23, a first flat layer 31 and a color filter layer 41. The array structure layer in the second non-display area B2 includes a first insulating layer 12 and a second insulating layer 15 stacked on the silicon-based underlay substrate 10. The second non-display area B2 does not emit light. The second non-display area B2 may also be referred to as a Dummy area.

As shown in FIG. 2, the third non-display area B3 may include an array structure layer disposed on the silicon-based underlay substrate 10, a first connection electrode 19 disposed on the array structure layer, a cathode 23 connected with the first connection electrode 19, a first encapsulation layer 30 disposed on the cathode 23, a first flat layer 31, and a color filter layer 41. The boundary of the cathode 23 may be located in the third non-display area B3. The array structure layer in the third non-display area B3 includes a first insulating layer 12 disposed on the silicon-based underlay substrate 10, a second connection electrode 18 disposed on the first insulating layer 12, and a second insulating layer 15 covering the second connection electrode 18. The first insulating layer 12 is provided with a first via exposing a power supply electrode of the silicon-based underlay substrate 10. A first conductive pillar 13 is disposed in the first via, and the second connection electrode 18 is connected with the power supply electrode through the first conductive pillar 13. The second insulating layer 15 is provided with a second via exposing the second connection electrode 18. A second conductive pillar 16 is disposed in the second via. The first connection electrode 19 is connected to the second connection electrode 18 through the second via. The cathode 23 can be connected with the first connection electrode 19 through a cathode via disposed on the pixel definition layer 24. In this way, the first connection electrode 19 and the second connection electrode 18 form a conductive channel between the cathode 23 and the power supply electrode, and a voltage signal provided by the power supply electrode is transmitted to the cathode 23 through the conductive channel, thus realizing a cathode ring structure. The cathode 23 is a planar electrode disposed on a whole layer, and the first connection electrode 19 and the second connection electrode 18 are respectively disposed to surround the auxiliary display area. The third non-display area B3 may also be referred to as a cathode ring area. In order to ensure etching uniformity, the pattern design of the cathode ring is consistent with the pattern design of the main display area A1 and the auxiliary display area A2.

As shown in FIG. 2, the color filter layer 41 in the first non-display area B1, the second non-display area B2 and the third non-display area B3 includes three color filter units which are stacked. In some examples, the second color filter unit (e.g., a red unit) 52, the third color filter unit (e.g., a green unit) 53, and the first color filter unit (e.g., a blue unit) 51 are stacked sequentially. However, the present disclosure does not limit the stacking order of the color filter units. For example, the third color filter unit, the second color filter unit, and the first color filter unit may be stacked sequentially. The thickness of the color filter layer 41 in the first non-display area B1, the second non-display area B2 and the third non-display area B3 is greater than the thickness of the color filter layer 41 in the auxiliary display area A2. For example, the average thickness of the color filter layer 41 in the first non-display area B1, the second non-display area B2 and the third non-display area B3 is greater than the average thickness of the color filter layer 41 in the auxiliary display area A2.

An embodiment of the present disclosure provides a display substrate with a color filter layer covering the main display area, the auxiliary display area and the non-display area, which can effectively prevent the reflection by a lower-layer metal structure in the non-display area, so as to ensure the display effect, and enables the completion of the shading treatment on the non-display area at the same time during the preparation process of the color filter layer in the display area, thus simplifying the preparation process and improving the efficiency.

The technical solution of this embodiment is described below by an example of a preparation process of the display substrate. In this embodiment, the "patterning process" includes the treatments, such as film layer deposition, photoresist coating, mask exposure, development, etching, and photoresist stripping, which is a known mature preparation process. Deposition may be implemented by using a known process, such as sputtering, evaporation and chemical vapor deposition, coating may be implemented by using a known coating process, and etching may be implemented by using a known method, which is not limited here. In the description of this embodiment, it should be understood that "thin film" refers to a layer of thin film fabricated by a certain material on a base substrate by using a deposition or coating process. If the "thin film" does not require a patterning process or a photolithography process during the whole fabrication process, the "thin film" can also be called a "layer". If the "thin film" also requires a patterning process or a photolithography process throughout the fabrication process, it is referred to as a "thin film" before the patterning process and as a "layer" after the patterning process. The "layer" after a patterning process or a photolithography process contains at least one "pattern". In the present disclosure, "A and B being disposed on a same layer" means that A and B are formed at the same time by the same patterning process.

Figure 5:
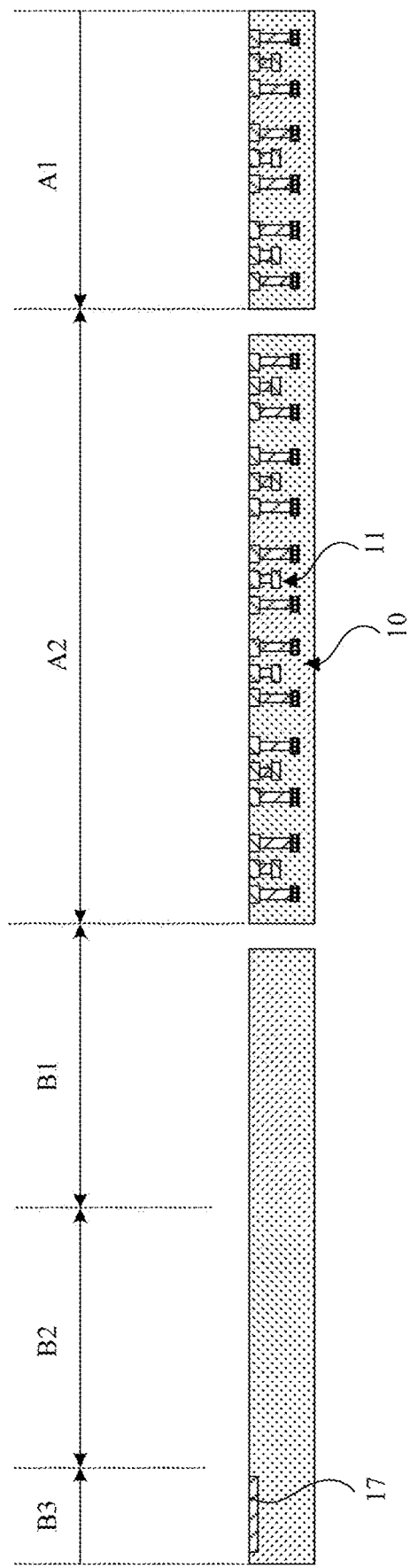
FIG. 5 is a schematic diagram of a structure after a silicon-based underlay substrate is formed according to at least one embodiment of the present disclosure.

(1) A silicon-based underlay substrate 10 is formed. The silicon-based underlay substrate 10 includes a main display area A1, an auxiliary display area A2, a first non-display area B1, a second non-display area B2 and a third non-display area B3. The main display area A1 and the auxiliary display area A2 include multiple display units. A pixel driving circuit is integrated in the silicon-based underlay substrate 10 of each display unit, and a power supply assembly is integrated in the silicon-based underlay substrate 10 in the non-display areas, as shown in FIG. 5. As an exemplary explanation, FIG. 5 illustrates driving transistors 11 included in the pixel driving circuits of three display units in the main display area A1 and six display units in the auxiliary display area A2, and illustrates power supply electrodes 17 included in the power supply assembly in the third non-display area B3.

In an exemplary embodiment, the driving transistor 11 in the main display area A1 and the auxiliary display area A2 includes an active layer, a gate electrode, a source electrode, a drain electrode and a gate connection electrode. The source electrode and the drain electrode are respectively connected with a doped area of the active layer through conductive pillars, and the gate connection electrode is connected with the gate electrode through a conductive pillar. The power supply electrode 17 in the third non-display area B3 is disposed on the same layer as the source electrode, the drain electrode and the gate connection electrode. The silicon-based underlay substrate 10 may be prepared by mature CMOS integrated circuit technology, which is not limited in the present disclosure. After the completion of the preparation, the surface of the silicon-based underlay substrate 10 exposes the source electrode, the drain electrode and the gate connection electrode in the main display area A1 and the auxiliary display area A2 and the power supply electrode 17 in the third non-display area B3.

In an exemplary embodiment, a material of the silicon-based underlay substrate may be any one or more of silicon, germanium and compound semiconductors. The compound semiconductors may include any one or more of silicon germanium, silicon carbide, gallium arsenide, gallium phosphide, indium phosphide, indium arsenide and indium antimonide. The silicon-based underlay substrate may be doped or undoped.

Figure 6:
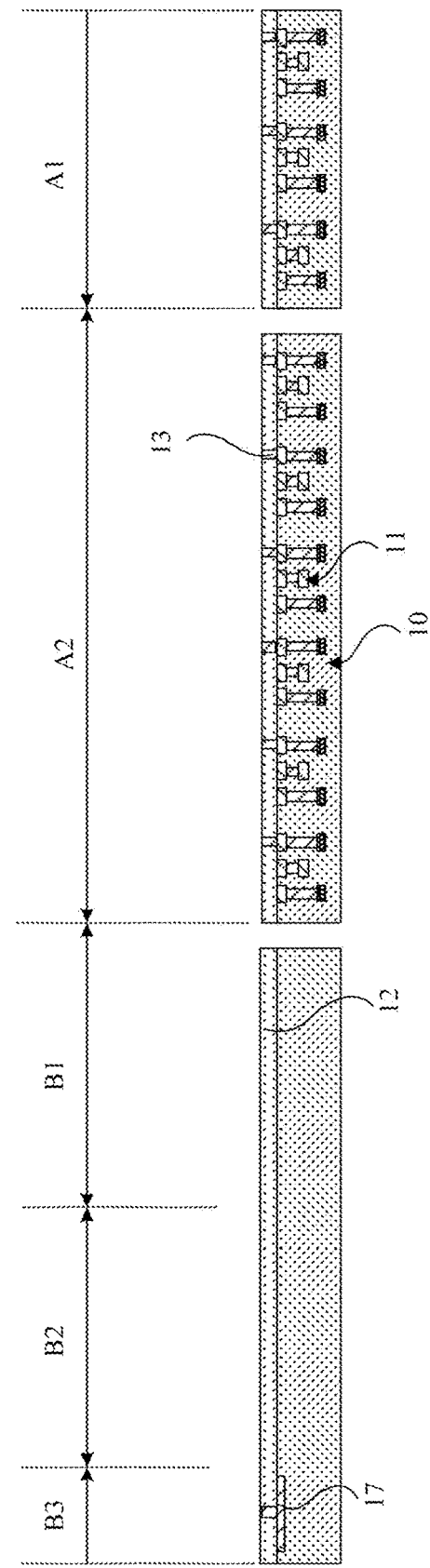
FIG. 6 is a schematic diagram of a structure after a first conductive pillar is formed according to at least one embodiment of the present disclosure.

(2) A first insulating thin film is deposited on the silicon-based underlay substrate 10. The first insulating thin film is patterned by a patterning process to form a pattern of a first insulating layer 12 covering the silicon-based underlay substrate 10. The first insulating layer 12 in the main display area A1, the auxiliary display area A2 and the third non-display area B3 is formed with multiple first vias respectively exposing the drain electrode of each display unit and the power supply electrode 17 in the third non-display area B3. Then, multiple first conductive pillars 13 are formed in the first vias on the first insulating layer 12. The first conductive pillars 13 in the first vias in the main display area A1 and the auxiliary display area A2 are connected with the drain electrodes of the display units where the first conductive pillars 13 are located, and the first conductive pillars 13 in the second vias in the third non-display area B3 are connected with the power supply electrodes 17, as shown in FIG. 6.

In an exemplary embodiment, the first conductive pillar 13 may be made of a metal material. After the formation of the first conductive pillars 13 by a filling treatment, polishing treatment may also be carried out to corrode and rub the surfaces of the first insulating layer 12 and the first conductive pillars 13 by a polishing process to remove part of the thickness of the first insulating layer 12 and the first conductive pillars 13, so that the first insulating layer 12 and the first conductive pillars 13 have flush surfaces. In some possible implementations, tungsten (W) may be used for the first conductive pillar 13, and the via filled with tungsten is called a W-via. When the thickness of the first insulating layer 12 is relatively large, the use of W-vias may ensure stability of the conductive path. Due to the mature process for fabricating W-vias, the resultant first insulating layer 12 has good surface flatness, which is beneficial to reducing contact resistance. In the present disclosure, W-vias are not only suitable for connection between the silicon-based underlay substrate 10 and the reflective electrodes, but also suitable for connection between the reflective electrodes and the anodes, and connection between other wiring layers.

Figure 7:
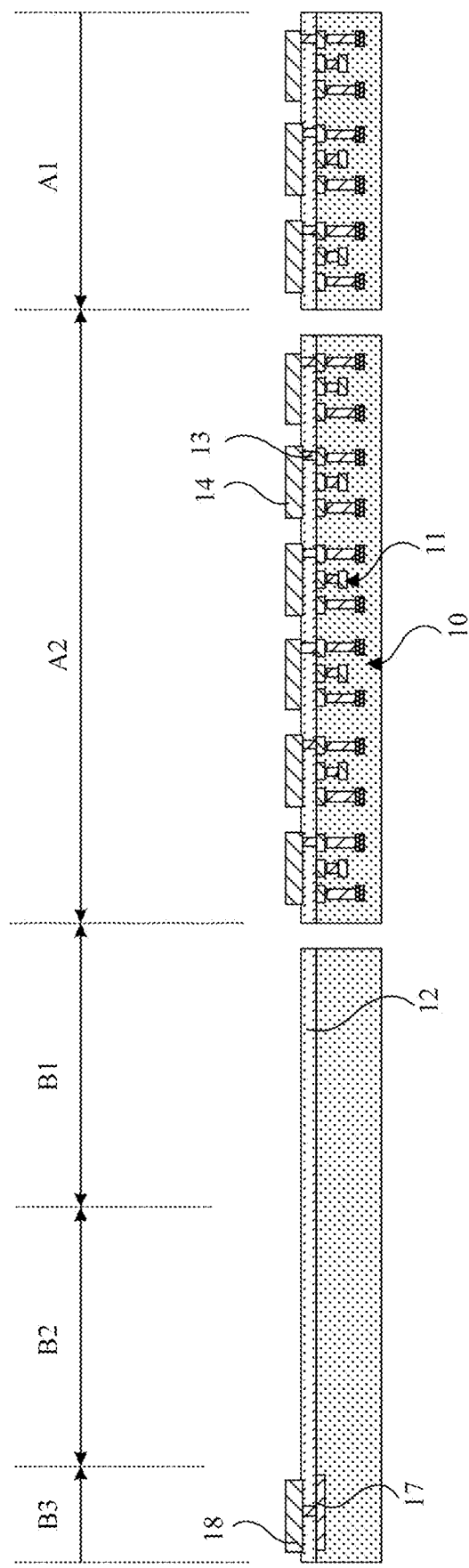
FIG. 7 is a schematic diagram of a structure after a reflective electrode is formed according to at least one embodiment of the present disclosure.

(3) A first metal thin film is deposited on the silicon-based underlay substrate 10 on which the above structure is formed. The first metal thin film is patterned by a patterning process to form a pattern of a reflective electrode on the first insulating layer 12 in the main display area A1 and the auxiliary display area A2, and form a pattern of a second connection electrode 18 on the first insulating layer 12 in the third non-display area B3. In each display unit in the main display area A1 and the auxiliary display area A2, the reflective electrode 14 is connected to the drain electrode of the driving transistor 11 through the first conductive pillar 13, and in the third non-display area B3, the second connection electrode 18 is connected to the power supply electrode 17 through the first conductive pillar 13, as shown in FIG. 7.

In an exemplary embodiment, the power supply electrode 17 in the third non-display area B3 is configured to supply a voltage signal received from the outside to a driving pixel electrode and the cathode. The reflective electrode 14 of each display unit can form a conductive path between the pixel driving circuit and the anode, and can also form a microcavity structure with a cathode formed later. This causes, by utilizing the strong reflection effect of the reflective electrode, the light directly emitted by the organic light emitting layer and the light reflected by the reflective electrode to interfere with each other, thereby improving the color gamut of the emitted light and enhancing the brightness of the emitted light.

Figure 8:
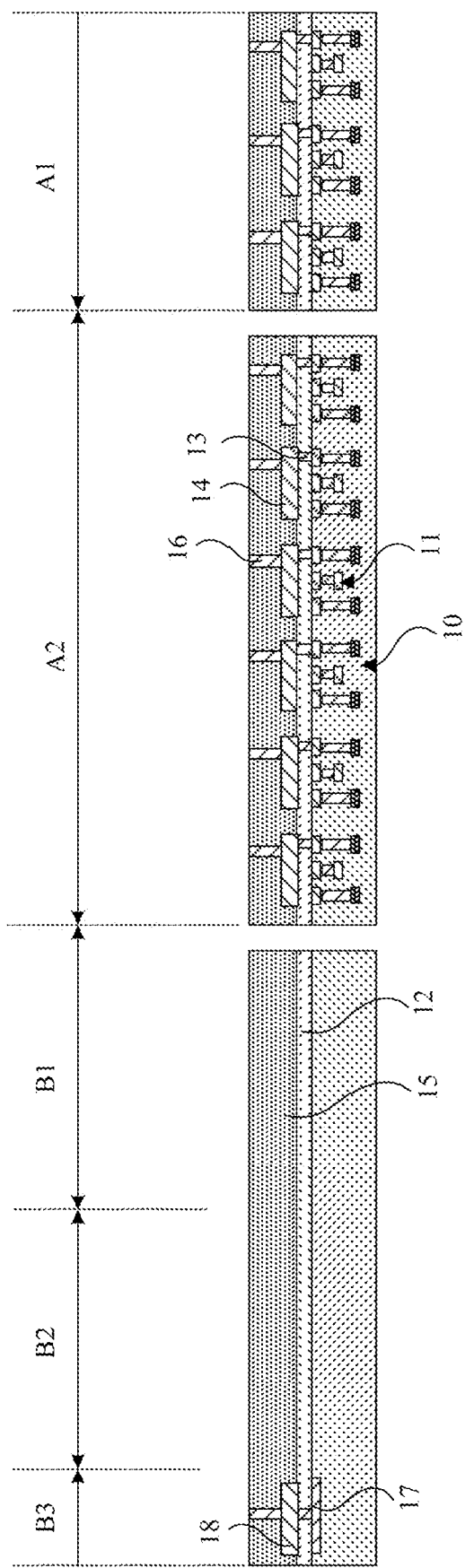
FIG. 8 is a schematic diagram of a structure after a second conductive pillar is formed according to at least one embodiment of the present disclosure.

(4) A second insulating thin film is deposited on the silicon-based underlay substrate 10 on which the aforementioned structure is formed, and the second insulating thin film is patterned by a patterning process to form a pattern of a second insulating layer 15 covering the silicon-based underlay substrate 10. The second insulating layer 15 in the main display area A1, the auxiliary display area A2 and the third non-display area B3 is formed with multiple second vias, which respectively expose the reflective electrode 14 of each display unit and the second connection electrode 18 in the third non-display area B3. Then, multiple second conductive pillars 16 are formed in multiple second vias on the second insulating layer 15. The second conductive pillars 16 in the second vias in the main display area A1 and the auxiliary display area A2 are connected with the reflective electrodes 14 of the display units where the second conductive pillars 16 are located, and the second conductive pillars 16 in the second vias in the third non-display area B3 are connected with the second connection electrodes 18, as shown in FIG. 8.

In an exemplary embodiment, the second conductive pillar 16 may be made of a metal material. After the formation of the second conductive pillars 16 by a filling treatment, polishing treatment may also be carried out to corrode and rub the surfaces of the second insulating layer 15 and the second conductive pillars 16 by a polishing process to remove part of the thickness of the second insulating layer 15 and the second conductive pillars 16, so that the second insulating layer 15 and the second conductive pillars 16 have flush surfaces. In some possible implementations, tungsten (W) may be used for the second conductive pillars 16.

Figure 9:
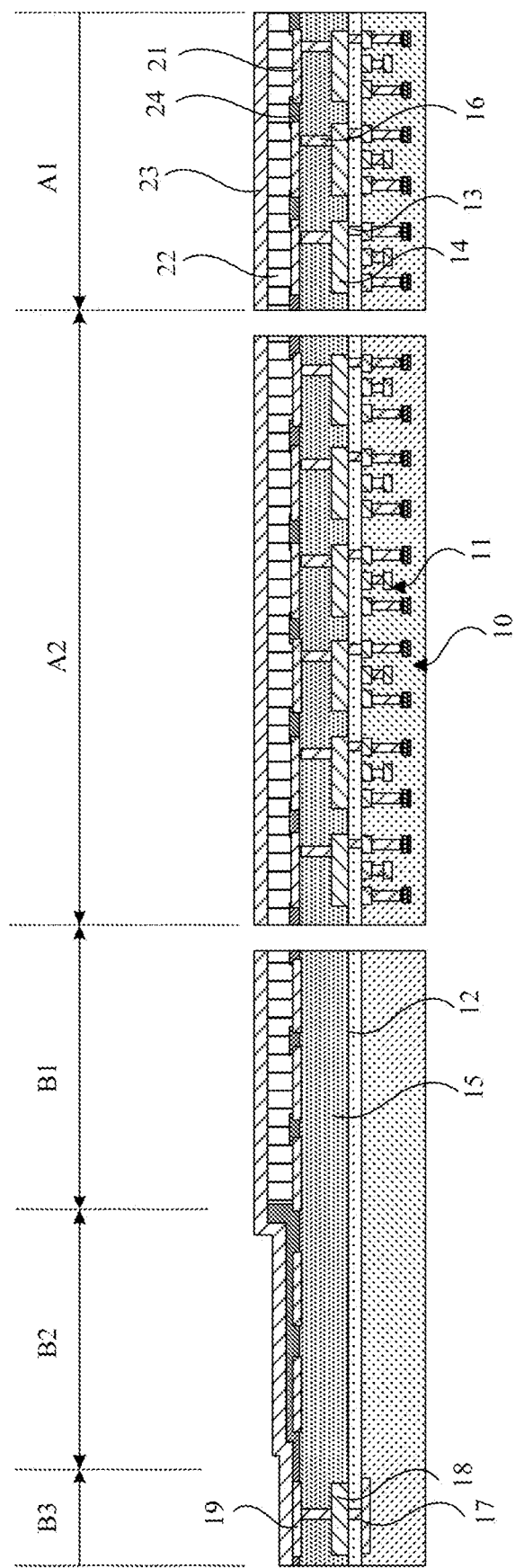
FIG. 9 is a schematic diagram of a structure after a light emitting structure layer is formed according to at least one embodiment of the present disclosure.

(5) A transparent conductive thin film is deposited on the silicon-based underlay substrate 10 on which the aforementioned structure is formed, and the transparent conductive thin film is patterned by a patterning process to form a pattern of an anode layer and a pattern of a first connection electrode 19 on the second insulating layer 15. The anode layer includes multiple anodes 21 disposed in the main display area A1, the auxiliary display area A2, the first non-display area B1 and the second non-display area B2. In each display unit in the main display area A1 and the auxiliary display area A2, the anode 21 is connected with the reflective electrode 14 through the second conductive pillar 16, as shown in FIG. 9. In an embodiment of the present disclosure, the anodes 21 in the main display area A1 and the auxiliary display area A2 are connected with the reflective electrodes 14 through the second conductive pillars 16, and the reflective electrodes 14 are connected with the drain electrodes of the driving transistors 11 through the first conductive pillars 13. In this way, an electrical signal provided by the pixel driving circuit is transmitted to the anode 21 through the reflective electrode 14. The reflective electrode 14 forms a conductive channel between the pixel driving circuit and the anode 21, and also forms a microcavity structure with the cathode 23, which is not only beneficial to control of the light emitting devices by the pixel driving circuit, but also makes the structure of the display substrate more compact, and therefore is conducive to miniaturization of a silicon-based OLED display apparatus.

In an embodiment of the present disclosure, the first connection electrode 19 is formed in the third non-display area B3, and the first connection electrode 19 is not connected with the anode 21. The first connection electrode 19 is connected to the second connection electrode 18 through the second conductive pillar 16.

(6) A pixel definition thin film is coated onto the silicon-based underlay substrate 10 on which the above structure is formed, and a pattern of a pixel definition layer (PDL) 24 is formed by masking, exposure and development processes. In each display unit, the pixel definition layer 24 exposes the surface of each anode 21, and in the third non-display area B3, the pixel definition layer 24 may be formed with a cathode via to expose the surface of the first connection electrode 19. Then, an organic light emitting layer 22 and a cathode 23 are formed sequentially in the main display area A1, the auxiliary display area A2, the first non-display area B1, and the second non-display area B2. In each display unit, the organic light emitting layer 22 directly covers the anode 21 of the display unit where the organic light emitting layer 22 is located, and the planar cathode 23 directly covers the organic light emitting layer 22 of each display unit. In the third non-display area B3, the cathode 23 is connected to the exposed first connection electrode 19, as shown in FIG. 9. In an exemplary embodiment, the cathode 23 may be a transflective electrode, and constitutes a microcavity structure with the reflective electrode 14 formed previously.

In an exemplary embodiment, the organic light emitting layer 22 may be a single-layer or multi-layer structure. For example, in some examples, the organic light emitting layer 22 may include a light emitting layer and a multi-layer structure consisting of one or more film layers including a hole injection layer, an electron injection layer, a hole transporting layer, an electron transporting layer, an electron blocking layer and a hole blocking layer. For example, the organic light emitting layer 22 may be made of an organic material, and emits light under the driving of the voltages of the anode 21 and the cathode 23 by utilizing the light emitting property of the organic material according to a required gray scale.

In an exemplary embodiment, the light emitting device is an OLED light emitting device, including an anode, an organic light emitting layer and a cathode. For example, the light emitting device emits white light. For example, the light emitting device emitting white light may be implemented by a light emitting device that emits white light, for example, by an organic light emitting layer combination including multiple organic light emitting layers. For example, the organic light emitting layer combination includes three organic light emitting layers emitting red, green and blue light, respectively. The three organic light emitting layers are stacked sequentially relative to the silicon-based underlay substrate, thereby emitting white light as a whole. Alternatively, the organic light emitting layer combination includes an organic light emitting layer emitting light of a color and an organic light emitting layer emitting light of a complementary color of the color. The two organic light emitting layers are stacked sequentially relative to the silicon-based underlay substrate, thereby emitting white light as a whole. The two organic light emitting layers include, for example, an organic light emitting layer emitting light of red color and an organic light emitting layer emitting light of a complementary color of the red color, which is not limited in the embodiments of the present disclosure as long as the emission of white light can be realized.

In the aforementioned preparation process, the first insulating thin film and the second insulating thin film may be made of silicon oxide (SiOx), silicon nitride (SiNx), or silicon oxynitride (SiON), and may be a single-layer structure or a multi-layer composite structure. The first metal thin film may adopt metal materials, such as argentum (Ag), copper (Cu), aluminum (Al) or molybdenum (Mo), or alloy materials composed of metals, such as aluminum neodymium alloy (AlNd) or molybdenum niobium alloy (MoNb), and the alloy material may be a single-layer structure or a multi-layer composite structure, such as a Mo/Cu/Mo composite structure. The transparent conductive thin film can adopt indium tin oxide (ITO) or indium zinc oxide (IZO), or a composite structure of ITO/Ag/ITO. Polyimide, acrylic, polyethylene terephthalate or the like may be used for the pixel definition layer.

Figure 10:
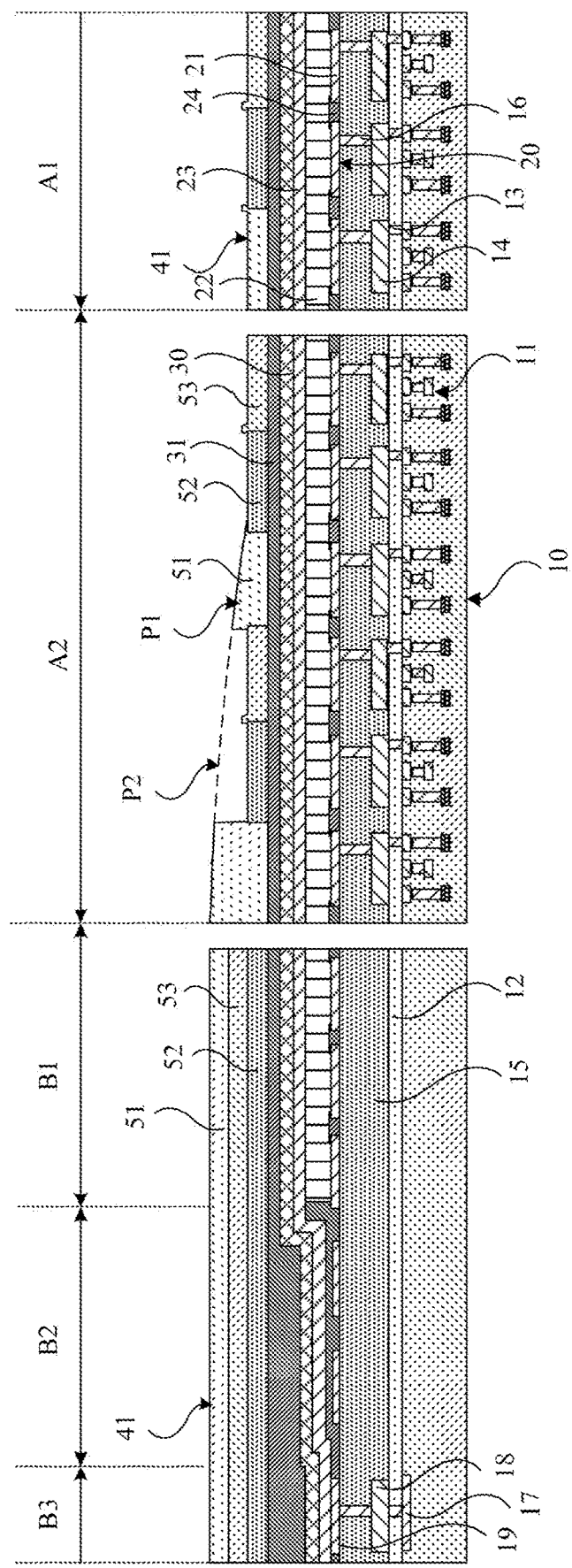
FIG. 10 is a schematic diagram of a structure after a color filter layer is formed according to at least one embodiment of the present disclosure.

(7) Patterns of a first encapsulation layer 30 and a first flat layer 31 are formed on the silicon-based underlay substrate 10 on which the above structure is formed, as shown in FIG. 10. For example, the first encapsulation layer 30 can be made of one or a combination of organic materials or inorganic materials with good sealing property, so as to achieve good sealing effect and protect the light emitting device. In some examples, the first encapsulation layer 30 may be a thin film encapsulation structure, which may be a single-layer or multi-layer structure. For example, the encapsulation layer 30 may include a first inorganic encapsulation layer, a first organic encapsulation layer and a second inorganic encapsulation layer which are stacked sequentially. The first inorganic encapsulation layer may include silicon nitride. The second inorganic encapsulation layer may include aluminum oxide. The first organic encapsulation layer may include at least one layer of parylene molecules. The thickness of the first inorganic encapsulation layer in a direction of a plane perpendicular to the silicon-based underlay substrate 10 may be greater than the thickness of the second inorganic encapsulation layer in the direction of a plane perpendicular to the silicon-based underlay substrate 10. The thickness of the first organic encapsulation layer in the direction of a plane perpendicular to the silicon-based underlay substrate 10 is greater than the thickness of the first inorganic encapsulation layer in the direction of a plane perpendicular to the silicon-based underlay substrate 10. However, this is not limited in the present disclosure.

The first flat layer 31 is configured to planarize the main display area A1, the auxiliary display area A2, and the peripheral area B. The material of the first flat layer 31 includes, but is not limited to, polysiloxane-based materials, acrylic-based materials, polyimide-based materials, and the like.

(8) On the silicon-based underlay substrate 10 on which the aforementioned structure is formed, a pattern of a color filter layer 41 is formed in the main display area A1, the auxiliary display area A2, the first non-display area B1, the second non-display area B2 and the third non-display area B3 by coating of a color plastic film, masking, exposing and developing, as shown in FIG. 10. The color filter layer 41 in the main display area A1 and the auxiliary display area A2 includes a first color filter unit 51, a second color filter unit 52 and a third color filter unit 53 arranged periodically. In this example, the three color filter units may be prepared in the order of the second color filter unit 52, the third color filter unit 53 and the first color filter unit 51. In each period, the third color filter unit 53 may partially cover the surface of one side of the second color filter unit 52, and the first color filter unit 51 may partially cover the surface of the other side of the second color filter unit 52. In two adjacent periods, the first color filter unit in one period partially covers the surface of one side of the third color filter unit in the adjacent period. Different color filter units in the color filter layer 41 can overlap with each other as a black matrix. The color filter layer 41 in the first non-display area B1, the second non-display area B2 and the third non-display area B3 includes a second color filter unit 52, a third color filter unit 53 and a first color filter unit 51 which are stacked. For example, the second color filter unit 52 may be a red light unit that only allows red light to pass through, the third color filter unit 53 may be a green light unit that only allows green light to pass through, and the first color filter unit 51 may be a blue light unit that only allows blue light to pass through. At this time, the color filter unit located on the uppermost layer in the peripheral area B is the blue light unit.

In some examples, the dimensions of the first color filter unit, the second color filter unit and the third color filter unit may be the same. However, this is not limited in the present disclosure. For example, the dimension of the blue light unit may be greater than the dimension of the red light unit, and the dimension of the red light unit may be greater than the dimension of the green light unit; or the dimension of the blue light unit may be greater than the dimension of the green light unit, and the dimension of the green light unit may be equal to the dimension of the red light unit.

As shown in FIG. 10, the three color filter units in the main display area A1 and the auxiliary display area A2 are arranged periodically, while the three color filter units in the first non-display area B1, the second non-display area B2 and the third non-display area B3 are stacked. The thickness of the color filter layer 41 in the first non-display area B1, the second non-display area B2 and the third non-display area B3 is greater than the thickness of the color filter layer 41 in the main display area A1 and the auxiliary display area A2. In the auxiliary display area A2, in the direction from the peripheral area B to the display area A, each first color filter unit 51 has a slope P1, and the thickness of the slope P1 decreases in the direction from the peripheral area B to the display area A. Furthermore, thicknesses of slopes P1 of first color filter units 51 in multiple continuous periods in the direction from the peripheral area B to the display area A decrease continuously, that is, the thicknesses of the slopes of the first color filter units 51 in multiple continuous periods exhibit a decreasing trend as a whole, forming a slope P2 as shown in FIG. 10. In some examples, the thickness of the color filter layer 41 at the junction between the auxiliary display area A2 and the main display area A1 is substantially equal to the thickness of a single-layer color filter unit. The thickness of the color filter layer 41 at the junction between the auxiliary display area A2 and the first non-display area B1 is greater than the thickness of a single-layer color filter unit. In some examples, the thicknesses of the second color filter unit 52 and the third color filter unit 53 in the auxiliary display area A2 and the first color filter unit 51, the second color filter unit 52 and the third color filter unit 53 in the main display area A1 are substantially equal.

In some possible implementations, the second color filter unit may be a blue unit only allowing blue light to pass through, the third color filter unit may be a red unit only allowing red light to pass through, and the first color filter unit may be a green unit only allowing green light to pass through. The color filter layer may be prepared in the order of the second color filter unit, the third color filter unit and the first color filter unit. For example, the preparation process of the color filter layer includes: first forming a pattern of a blue unit in the main display area A1 and the auxiliary display area A2 and forming a layer of blue units in the peripheral area B, by coating of a blue color plastic film, mask exposure and development in the main display area A1, the auxiliary display area A2 and the peripheral area B; then forming a pattern of a red unit in the main display area A1 and the auxiliary display area A2 and forming a layer of red units, which is stacked on the blue units, in the peripheral area B, by coating of a red color plastic film, mask exposure and development in the main display area A1, the auxiliary display area A2 and the peripheral area B; and then forming a pattern of a green unit in the main display area A1 and the auxiliary display area A2 and forming a layer of green units, which is stacked on the red units, in the peripheral area B, by coating of a green color plastic film, mask exposure and development in the main display area A1, the auxiliary display area A2 and the peripheral area B. The adhesion of the blue color filter is relatively high, and forming the blue unit first can reduce the possibility of the color filter layer being stripped from the cathode. Since the red unit has relatively low adhesion but good fluidity, the quantity of bubbles on the surface of one side of the blue unit and the red unit away from the cathode can be reduced in the process of forming the red units, so that the uniformity of the thickness of the film at the overlapping position of the blue unit and the red unit can be improved. Since the matrix materials of the green units and the red units are substantially the same, the adhesive force between the green units and the red units is relatively large, which can reduce the possibility of the color filter layer being stripped from the cathode. In this example, the color filter unit located at the uppermost layer in the peripheral area is the green unit. The stacking order of the color filter units in the peripheral area is determined by the preparation process of the color filter layer. In some possible implementations, the color filter layer may include units of other colors, e.g., white units, yellow units or the like.

Figure 11:
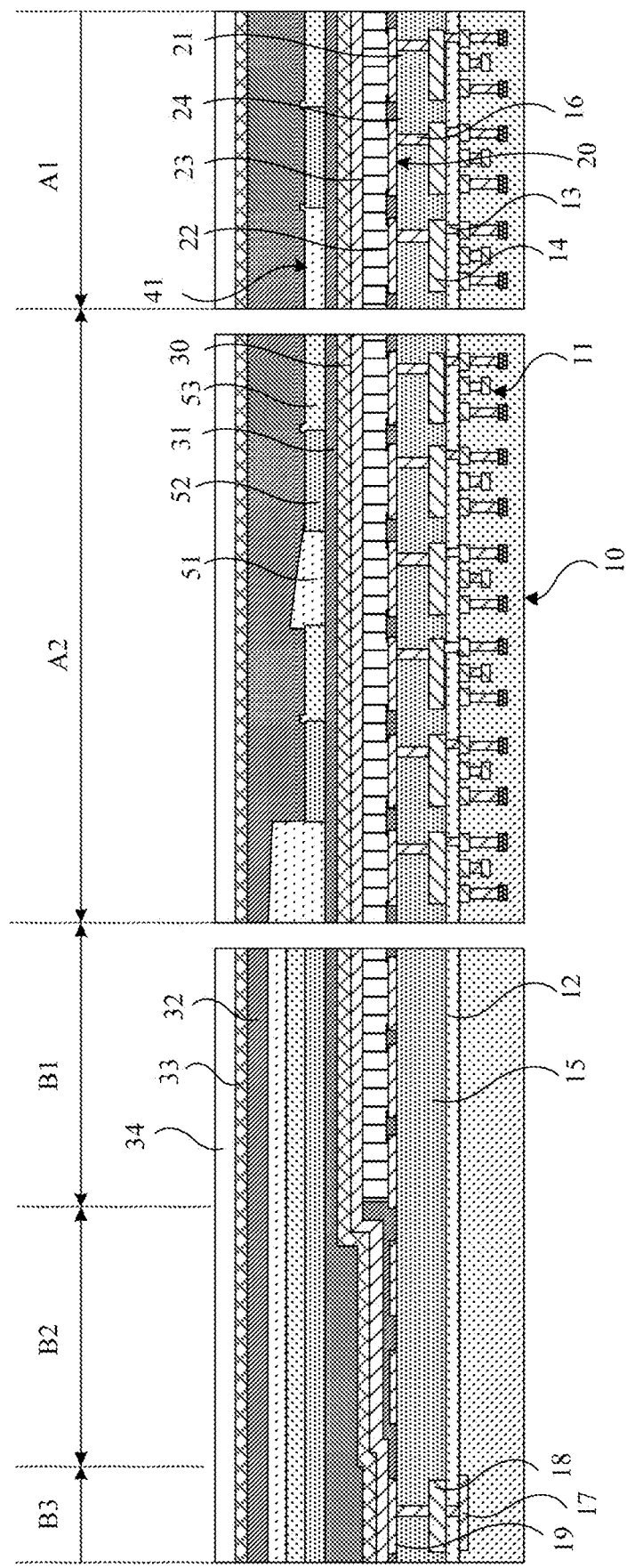
FIG. 11 is a schematic diagram of a structure after a cover panel is formed according to at least one embodiment of the present disclosure.

(9) A second flat layer 32, a second encapsulation layer 33 and a cover panel 34 are formed on the silicon-based underlay substrate 10 on which the aforementioned structure is formed, as shown in FIG. 11. The material of the second flat layer 32 includes, but is not limited to, polysiloxane-based materials, acrylic-based materials, polyimide-based materials, and the like.

The second encapsulation layer 33 and the cover panel 34 can protect the color filter layer 41. In some examples, the second encapsulation layer 33 may include: a second organic encapsulation layer and a third inorganic encapsulation layer which are stacked; and the second organic encapsulation layer includes at least one layer of parylene molecules, and the third inorganic encapsulation layer includes silicon oxide. The thickness of the second organic encapsulation layer in a direction of a plane perpendicular to the silicon-based underlay substrate 10 is greater than the thickness of the third inorganic encapsulation layer in a direction of a plane perpendicular to the silicon-based underlay substrate 10. However, this is not limited in the present disclosure.

The cover panel 34 and the silicon-based underlay substrate 10 may be fixed by a sealant. The silicon-based underlay substrate 10, the cover panel and the sealant together form a closed space, which therefore can provide protection against water and oxygen, so that the service life of the silicon-based OLED display substrate is greatly prolonged.

In an embodiment of the present disclosure, for example, it is feasible to fabricate a silicon-based underlay substrate and prepare a reflective electrode on the silicon-based underlay substrate by a wafer factory, and then prepare a light emitting structure layer and structures thereon by a display panel factory, which not only reduces the manufacturing difficulty of the reflective electrode, but also facilitates the subsequent technological processes of the panel factory.

As can be seen from the structure of a display substrate according to an embodiment of the present disclosure and the preparation process thereof, the color filter layer in an embodiment of the present disclosure may be prepared by mature processes such as photolithography, photoresist removal, etc., and the preparation process is simple and mature, which can effectively reduce the production cost.

The structure shown in the present disclosure and the preparation process thereof are merely an exemplary description. In an exemplary embodiment, corresponding structures may be changed and patterning processes may be added or reduced according to actual needs. For example, the orthographic projection of the transition structure of the color filter layer on the silicon-based underlay substrate may overlap with the auxiliary display area and the first non-display area, that is, the transition structure of the color filter layer may be located in the auxiliary display area and the first non-display area. The structure (or method) shown in the present embodiment may be appropriately combined with the structure (or method) shown in another embodiment.

Figure 12:
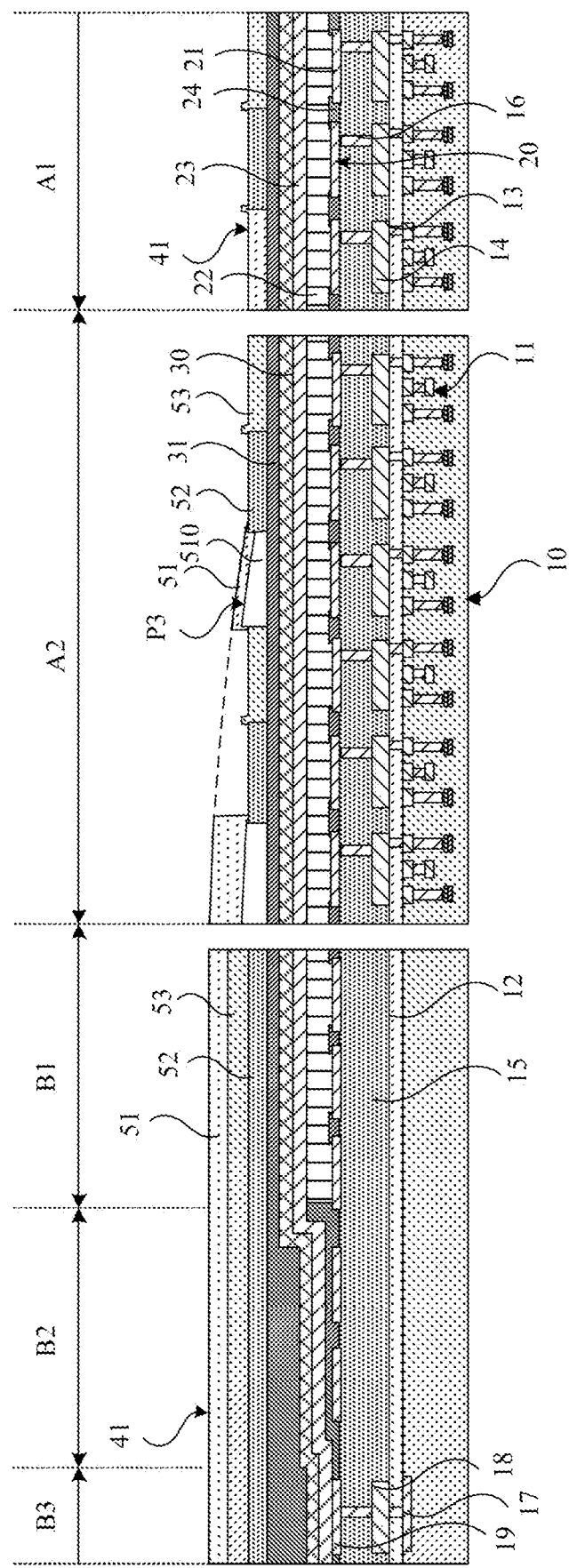
FIG. 12 is a schematic diagram of a structure of a display substrate according to at least one embodiment of the present disclosure.

FIG. 12 is a schematic diagram of a structure of a display substrate according to at least one embodiment of the present disclosure. As shown in FIG. 12, in this embodiment, the area corresponding to the first color filter unit 51 in the auxiliary display area A2 includes a suspension area 510 with a slope P3; the other structures of the display substrate may be similar to those in the embodiment shown in FIG. 2. In this embodiment, in the preparation process of the color filter layer 41, since the color glue coated in the auxiliary display area A2 that forms the first color filter unit 51 will have a slope area, under the condition of the same exposure amount, due to insufficient exposure depth of the slope area, the color glue under the slope area is taken out to form a suspension area 510 that also has a slope P3.

In this embodiment, the orthographic projection of the transition structure of the color filter layer 41 on the silicon-based underlay substrate 10 can completely overlap with the auxiliary display area A1 of the display area A, and the proportion of the auxiliary display area A2 in the whole display area A is not greater than 5%. The transition structure of the color filter layer 41 is located in the auxiliary display area A2.

In this embodiment, the suspension area 510 can be, for example, a cavity located between the first color filter unit 51 and the first flat layer 31, and the interior of the cavity can be filled with air. The slope P3 of the suspension area 51 is at least located at an interface of the cavity in contact with and close to the first color filter unit 51. The suspension area 510 is in a plane parallel to the silicon-based underlay substrate, and the dimension of the suspension area 510 in the direction from the peripheral area B to the display area A is smaller than that of the first color filter unit 51 in this direction.

In this embodiment, the suspension area 510 at the junction of the auxiliary display area A2 and the first non-display area B1 is in a plane parallel to the silicon-based underlay substrate 10, and side walls of both sides of the cavity in the direction from the peripheral area B to the display area A respectively include a side wall of a boundary of a stack structure of the first color filter unit 51, the second color filter unit 52 and the third color filter unit 53 in the first non-display area B1 and a side wall of the second color filter unit 52 directly adjacent to the first color filter unit 51 in the auxiliary display area A2. The suspension area 510 in the auxiliary display area A2 away from the first non-display area B1 is in a plane parallel to the silicon-based underlay substrate 10, and side walls of both sides of the cavity in the direction from the peripheral area B to the display area A respectively include side walls of the second color filter unit 52 and the third color filter unit 53 directly adjacent to the first color filter unit 51 in the auxiliary display area A2.

In this embodiment, the first color filter unit 51 at the junction of the auxiliary display area A2 and the first non-display area B1 may partially cover the surface of the first flat layer 31 in the first non-display area B1, and may also partially cover the surface of the adjacent second color filter unit 52 in the auxiliary display area A2. The first color filter unit 51 in the auxiliary display area A2 away from the first non-display area B1 may partially cover the surfaces of the adjacent second color filter unit 52 and the third color filter unit 53. In this way, it is possible to ensure the continuity of the color filter layer in the auxiliary display area A2.

In this embodiment, the gradient of the slope P2 of the suspension area 510 is substantially equal to that of the slope P1 of the first color filter unit 51 in the corresponding area. Thicknesses of slopes of suspension areas 510 in multiple continuous periods in the direction from the peripheral area B to the display area A decrease continuously, and the continuously decreasing overall gradient is substantially equal to the continuously decreasing overall gradient of the first color filter units 51 in multiple continuous periods.

As to the preparation process of the display substrate provided in this embodiment, reference may be made to the description of the previous embodiment, which hence will not be repeated here. The structure (or method) shown in the present embodiment may be appropriately combined with the structure (or method) shown in another embodiment.

Figure 13:
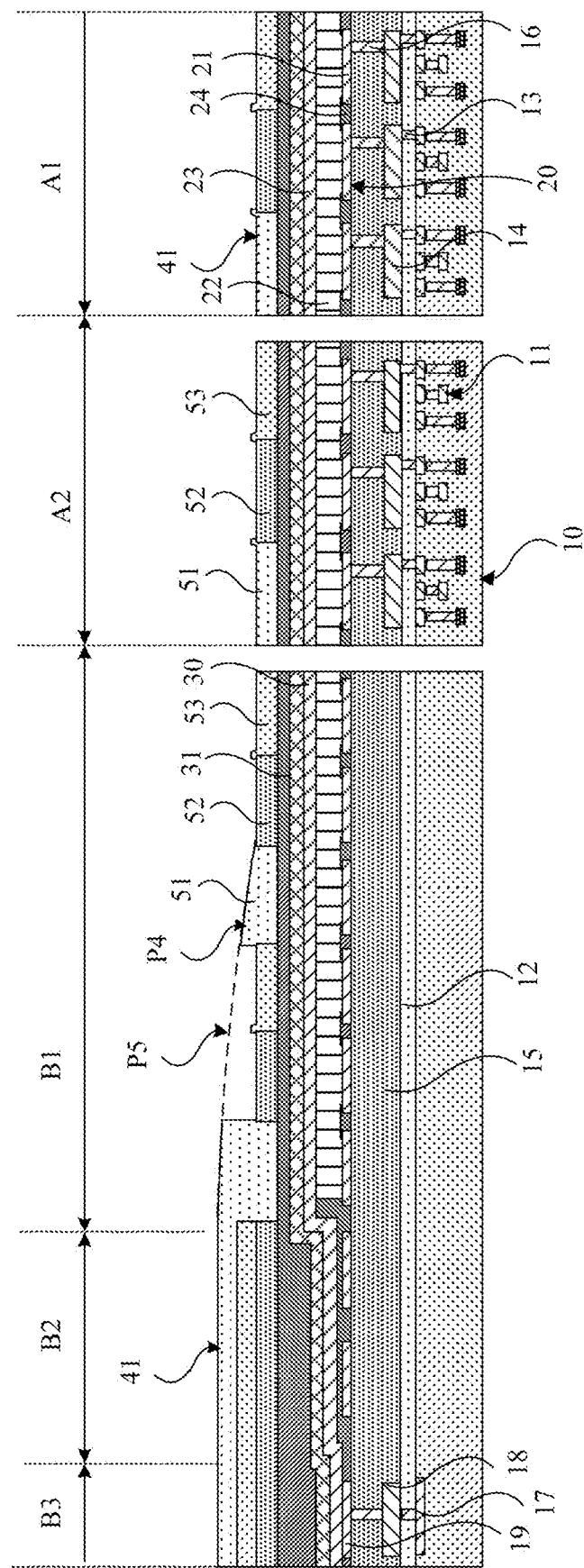
FIG. 13 is a schematic diagram of a structure of a display substrate according to at least one embodiment of the present disclosure.

FIG. 13 is a schematic diagram of a structure of a display substrate according to another embodiment of the present disclosure. As shown in FIG. 13, in this embodiment, the orthographic projection of the transition structure of the color filter layer 41 on the silicon-based underlay substrate 10 completely overlaps with the first non-display area B1 of the peripheral area B, that is, the transition structure of the color filter layer 41 is located in the first non-display area B1 and does not overlap with the display area A; and the other structures of the display substrate may be similar to those in the embodiment shown in FIG. 2. The color filter layer 41 in the first non-display area B1 includes a first color filter unit 51, a second color filter unit 52 and a third color filter unit 53 arranged periodically. The thickness of the color filter layer 41 in the first non-display area B1 close to the auxiliary display area A2 is substantially equal to the thickness of the color filter layer 41 in the auxiliary display area A2. There is a slope P5 in the color filter layer 41 in the first non-display area B1. The color filter layer 41 in the main display area A1 and the auxiliary display area A2 has relatively good uniformity, which can ensure display effect.

FIG. 13 illustrates six invalid display units in the first non-display area B1, and the drawing is only for illustration, which is not limited in the present disclosure. As shown in FIG. 13, in the first non-display area B1, color filter units are arranged periodically in an order of the first color filter unit 51, the second color filter unit 52 and the third color filter unit 53 in the direction from the peripheral area B to the display area A. In the direction from peripheral area B to display area A, the first color filter unit 51 in each period has a slope P4, and the thickness of the slope P4 decreases in the direction from the peripheral area B to the display area A. In other words, the thickness of the first color filter unit 51 in each period decreases gradually in the direction from the peripheral area B to the display area A. Furthermore, the thicknesses of the first color filter units 51 in multiple continuous periods in the direction from the peripheral area B to the display area A decrease continuously. FIG. 13 illustrates the first color filter units 51 in two continuous periods in the direction from the peripheral area B to the display area A in the first non-display area B1. As can be seen from FIG. 13, the minimum thickness of the slope P4 of the first color filter unit 51 close to the second non-display area B2 in two adjacent periods is greater than the maximum thickness of the slope P4 of the first color filter unit 51 away from the second non-display area B2. In the first non-display area A2, in the direction from the peripheral area B to the display area A, the thicknesses of the first color filter units 51 in multiple continuous periods exhibit a continuously decreasing trend as a whole, as shown by the slope P5 indicated by the dotted line in FIG. 13.

As shown in FIG. 13, the color filter layer 41 in the main display area A1 and the auxiliary display area A2 includes a first color filter unit (e.g., a blue unit) 51, a second color filter unit (e.g., a red unit) 52, and a third color filter unit (e.g., a green unit) 53 that are arranged periodically. The color filter layer 41 in the second non-display area B2 and the third non-display area B3 includes a second color filter unit 52, a third color filter unit 53 and a first color filter unit 51 which are stacked. The stacking order of the color filter units in the second non-display area B1 and the third non-display area B3 is related to the preparation order of the color filter units. The thickness of the color filter layer 41 in the second non-display area B2 and the third non-display area B3 is greater than the thickness of the color filter layer 41 in the first non-display area B1.

As shown in FIG. 13, the thickness of the color filter layer 41 in the first non-display area B1 close to the auxiliary display area A2 is substantially equal to the average thickness of the color filter layer in the auxiliary display area A2.

For example, the thicknesses of the first color filter unit 51, the second color filter unit 52 and the third color filter unit 53 in the auxiliary display area A2 and the second color filter unit 52 and the third color filter unit 53 in the first non-display area B1 are substantially equal. In this embodiment, there is a height difference between the color filter layers 41 in the first non-display area B1. Since the first non-display area B1 will not be lit, the height difference between the color filter layers 41 in the first non-display area B1 will not affect the display effect of the display substrate.

In an embodiment of the present disclosure, the thicknesses of the color filter layers 41 in the main display area A1 and the auxiliary display area A2 are substantially equal. The thicknesses of the first color filter unit, the second color filter unit and the third color filter unit in the main display area A1 and the first color filter unit, the second color filter unit and the third color filter unit in the auxiliary display area A2 are substantially equal. In an embodiment of the present disclosure, color filter layers with height differences are formed only in the first non-display area B1, which can ensure the overall uniformity of light color of the color filter layers in the main display area A1 and the auxiliary display area A2, thereby ensuring the display effect of the entire display area. Moreover, the color filter layer in an embodiment of the present disclosure may be prepared by mature processes such as photolithography, photoresist removal, etc. The preparation process is simple and mature, which can be realized just by improving the design of a photomask, and has relatively low cost.

The structure shown in the present disclosure and the preparation process thereof are merely an exemplary description. In an exemplary embodiment, corresponding structures may be changed and patterning processes may be added or reduced according to actual needs. For example, the orthographic projection of the transition structure of the color filter layer on the silicon-based underlay substrate may overlap with the first non-display area and the second non-display area, that is, the transition structure of the color filter layer may be located in the first non-display area and the second non-display area.

As to the preparation process of the display substrate provided in this embodiment, reference may be made to the description of the embodiment shown in FIG. 2, which hence will not be repeated here. The structure (or method) shown in the present embodiment may be appropriately combined with the structure (or method) shown in another embodiment.

Figure 14:
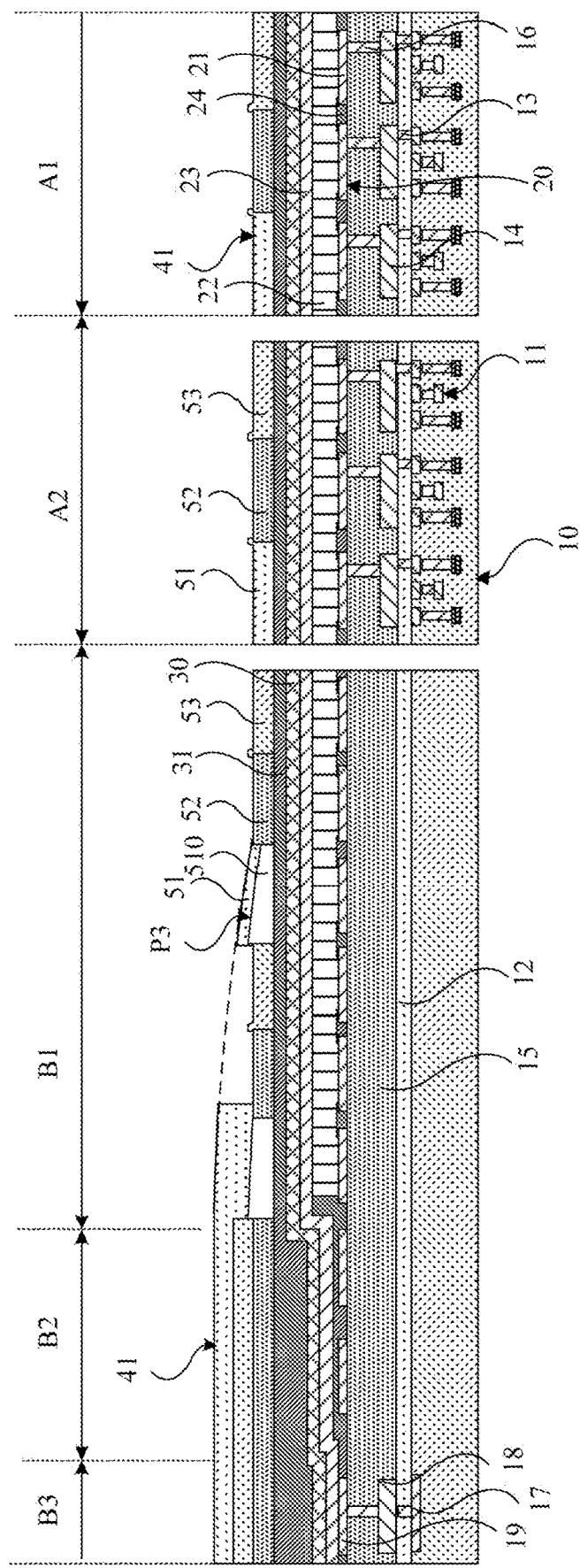
FIG. 14 is a schematic diagram of a structure of a display substrate according to at least one embodiment of the present disclosure.

FIG. 14 is a schematic diagram of a structure of a display substrate according to at least one embodiment of the present disclosure. As shown in FIG. 14, in this embodiment, the area corresponding to the first color filter unit 51 in the first non-display area B1 includes a suspension area 510 with a slope P3, and the other structures of the display substrate may be similar to those in the embodiment shown in FIG. 13. In this embodiment, in the preparation process of the color filter layer 41, since the color glue coated in the first non-display area B1 that forms the first color filter unit 51 will have a slope area, under the condition of the same exposure amount, due to insufficient exposure depth of the slope area, the color glue under the slope area is taken out to form a suspension area 510 that also has a slope P3. As to the description of the suspension area 510 included in the corresponding area of the first color filter unit in this embodiment, reference may be made to the description of the embodiment shown in FIG. 12, which will not be repeated here.

In this embodiment, the orthographic projection of the transition structure of the color filter layer 41 on the silicon-based underlay substrate 10 completely overlaps with the first non-display area B1, that is, the transition structure of the color filter layer 41 is located in the first non-display area B1.

As to the preparation process of the display substrate provided in this embodiment, reference may be made to the description of the embodiment shown in FIG. 2, which hence will not be repeated here. The structure (or method) shown in the present embodiment may be appropriately combined with the structure (or method) shown in another embodiment.

Figure 15:
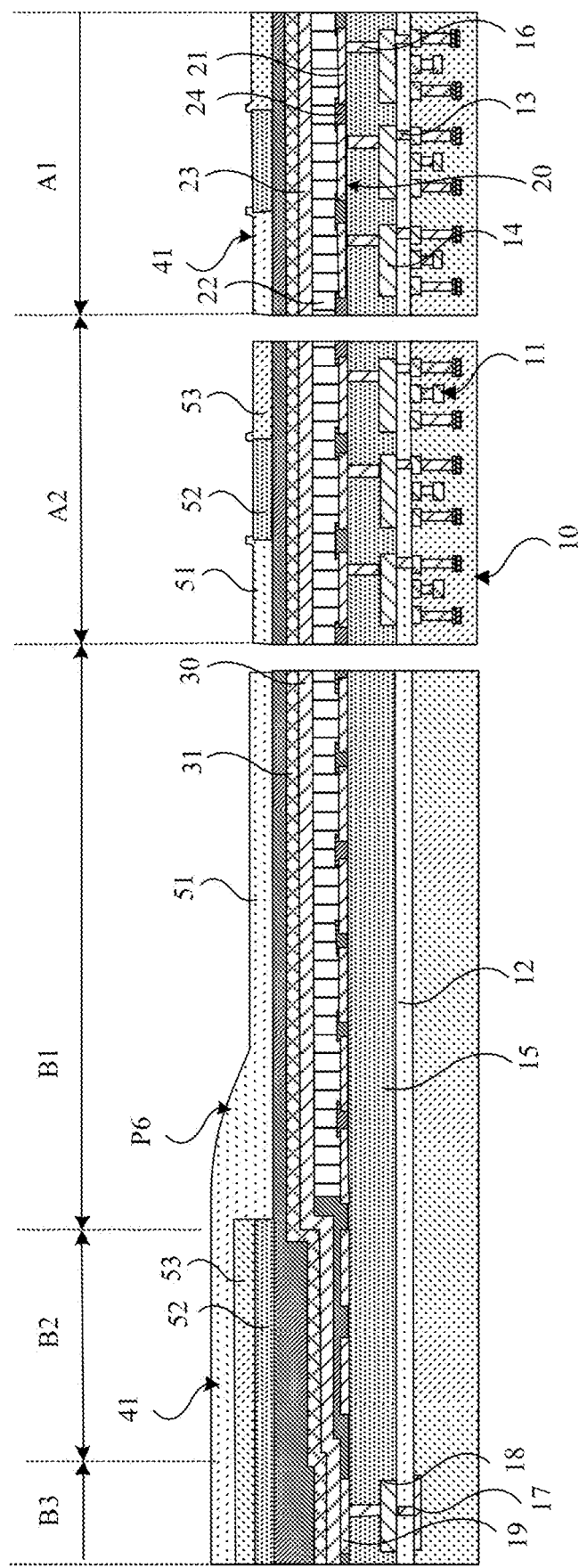
FIG. 15 is a schematic diagram of a structure of a display substrate according to at least one embodiment of the present disclosure.

FIG. 15 is a schematic diagram of a structure of a display substrate according to at least one embodiment of the present disclosure. As shown in FIG. 15, in this embodiment, the color filter layer 41 in the first non-display area B1 only includes the first color filter unit 51, and the other structures of the display substrate may be similar to those in the embodiment shown in FIG. 13. In this embodiment, in the process of sequentially preparing the second color filter unit (e.g., the red unit) 52, the third color filter unit (e.g., the green unit) 53 and the first color filter unit (e.g., the blue unit) 51, there is no need to form the third color filter unit 53 and the second color filter unit 52 in the first non-display area B1, and only a layer of first color filter unit 51 is formed at the end. In this example, the first color filter unit 51 may be a blue unit.

In this embodiment, the orthographic projection of the transition structure of the color filter layer 41 on the silicon-based underlay substrate 10 completely overlaps with the first non-display area B1 of the peripheral area B, that is, the transition structure of the color filter layer 41 is located in the first non-display area B1.

In this embodiment, the first color filter unit 51 in the first non-display area B1 has a slope P6. In some examples, the slope P6 may be located in an area of the first non-display area B1 away from the auxiliary display area A2 and close to the second non-display area B2. For example, the slope P6 may be located at the junction of the first non-display area B1 and the second non-display area B2. The slope P6 does not overlap with the auxiliary display area A2, in other words, the slope P6 does not overlap with the display unit of the display substrate. In some examples, the thickness of the first color filter unit 51 in the first non-display area B1 close to the second non-display area B2 is greater than the thickness of the first color filter unit 51 in the first non-display area B1 close to the auxiliary display area A2. The thickness of the first color filter unit 51 in the first non-display area B1 close to the auxiliary display area A2 is substantially equal to the thickness of the first color filter unit 51, the second color filter unit 52 and the third color filter unit 53 in the auxiliary display area A2.

In this embodiment, only one layer of first color filter unit 51 is formed in the first non-display area B1, and the thickness of the color filter layer in the first non-display area B1 close to the auxiliary display area A2 is substantially equal to the thickness of the color filter layer in the auxiliary display area A2, that is, there is a height difference between the color filter layers in the first non-display area B1, but there is no height difference between the color filter layers in the first non-display area B1 and the auxiliary display area A2. Therefore, the overall uniformity of light color of the color filter layer in the display area can be improved, and the display effect of the display substrate can be ensured. Moreover, the color filter layer in an embodiment of the present disclosure may be prepared by mature processes such as photolithography, photoresist removal, etc. The preparation process is simple and mature, which can be realized just by improving the design of a photomask, and has relatively low cost.

The structure shown in the present disclosure and the preparation process thereof are merely an exemplary description. In an exemplary embodiment, corresponding structures may be changed and patterning processes may be added or reduced according to actual needs. For example, the orthographic projection of the transition structure of the color filter layer on the silicon-based underlay substrate may overlap with the first non-display area and the second non-display area, that is, the transition structure of the color filter layer may be located in the first non-display area and the second non-display area.

As to the preparation process of the display substrate provided in this embodiment, reference may be made to the description of the embodiment shown in FIG. 2, which hence will not be repeated here. The structure (or method) shown in the present embodiment may be appropriately combined with the structure (or method) shown in another embodiment.

Figure 16:
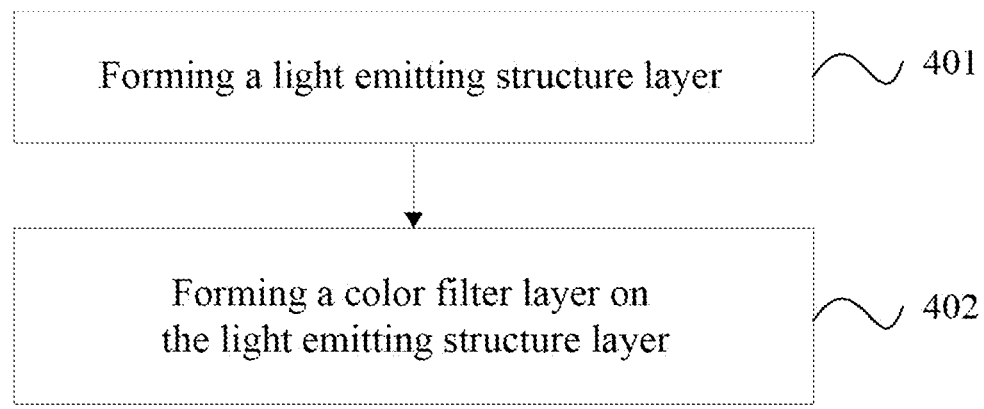
FIG. 16 is a flowchart of a method for preparing a display substrate according to at least one embodiment of the present disclosure.

FIG. 16 is a flowchart of a method for preparing a display substrate according to at least one embodiment of the present disclosure. As shown in FIG. 16, an embodiment of the present disclosure provides a method for preparing a display substrate, including the following steps.

In step 401, a light emitting structure layer is formed on a base substrate, wherein the base substrate has a display area and a peripheral area located at a periphery of the display area, the display area includes multiple pixel driving circuits connected with the light emitting structure layer in the display area, and the pixel driving circuit includes a transistor which includes an active layer located in an interior of the base substrate.

In step 402, a color filter layer is formed on the light emitting structure layer, wherein the color filter layer includes a transition structure, the transition structure of the color filter layer is located between the display area and the peripheral area of the base substrate, the transition structure includes at least one color filter unit, a thickness of the at least one color filter unit decreases in a direction from the peripheral area to the display area, and an overlapping area between an orthographic projection of the transition structure of the color filter layer on the base substrate and the display area of the base substrate is not greater than 5% of the display area.

In at least one exemplary embodiment, there is an overlapping area between the orthographic projection of the transition structure of the color filter layer on the base substrate and the display area; and forming the color filter layer in the display area includes: forming a first color filter unit, a second color filter unit and a third color filter unit which are arranged periodically in the display area. Color filter units in each period are arranged in an order of the first color filter unit, the second color filter unit and the third color filter unit in the direction from the peripheral area to the display area. In the transition structure, the first color filter unit in each period has a slope having a thickness decreasing in the direction from the peripheral area to the display area, and thicknesses of first color filter units in multiple continuous periods in the direction from the peripheral area to the display area decrease continuously. The thicknesses of the first color filter units in multiple continuous periods in the direction from the peripheral area to the display area decreasing continuously includes: an average thickness of the first color filter units in multiple continuous periods in the direction from the peripheral area to the display area continuously decreasing, or thicknesses of slopes of the first color filter units in multiple continuous periods in the direction from the peripheral area to the display area continuously decreasing.

In at least one exemplary embodiment, when there is an overlapping area between the orthographic projection of the transition structure on the base substrate and the display area, a ratio of an average thickness of the color filter layer in the overlapping area to an average thickness of the color filter layer in the display area other than the overlapping area ranges from 0.8 to 1.5 times. When there is no overlapping area between the orthographic projection of the transition structure on the base substrate and the display area, a ratio of an average thickness of the color filter layer in the transition structure close to the display area to an average thickness of the color filter layer in the display area ranges from 0.8 to 1.5 times. Alternatively, a thickness of the color filter layer at a junction between the transition structure and the display area is 0.8 to 1.5 times a thickness of a single-layer color filter unit.

In at least one exemplary embodiment, the peripheral area includes a first non-display area located at the periphery of the display area. Forming the color filter layer on the light emitting structure layer may include: sequentially forming a second color filter unit and a third color filter unit in the display area; and forming a first color filter unit in the display area and the first non-display area. In the display area, color filter units are arranged periodically in an order of the first color filter unit, the second color filter unit and the third color filter unit in the direction from the peripheral area to the display area; and a thickness of the first color filter unit in the first non-display area decreases in the direction from the peripheral area to the display area.

In at least one exemplary embodiment, before forming the light emitting structure layer in the display area, the preparation method according to an embodiment of the present disclosure may further include: forming a first insulating layer on the base substrate, the first insulating layer in the display area being formed with a first via exposing a driving transistor of the base substrate; forming a first conductive pillar in the first via; forming a reflective electrode on the first insulating layer in the display area, the reflective electrode being connected with the driving transistor through the first conductive pillar; forming a second insulating layer, the second insulating layer in the display area being formed with a second via exposing the reflective electrode; and forming a second conductive pillar in the second via, the second conductive pillar being connected with the reflective electrode. In this exemplary embodiment, forming a light emitting structure layer in the display area and the first non-display area includes: forming a first electrode on the second insulating layer, the first electrode being disposed in the display area and the first non-display area, and the first electrode in the display area being connected with the reflective electrode through the second conductive pillar; forming an organic light emitting layer connected with the first electrode in the display area and the first non-display area; and forming a second electrode connected with the organic light emitting layer in the display area and the first non-display area. The first electrode may be an anode and the second electrode may be a cathode.

In at least one exemplary embodiment, the peripheral area may include: a first non-display area located at the periphery of the display area, a second non-display area located at a periphery of the first non-display area and a third non-display area located at a periphery of the second non-display area. Forming the color filter layer may include: forming multiple color filter units, which are stacked, in the second non-display area and the third non-display area, to enable a thickness of the color filter layer in the second non-display area and the third non-display area to be greater than a thickness of the color filter layer in the first non-display area.

The preparation process of the display substrate has been described in detail in the previous embodiments and will not be repeated here.

An embodiment of the present disclosure further provides a display apparatus, including the display substrate described above. The display apparatus may be a silicon-based OLED display, a mobile phone, a tablet computer, a television, a display, a notebook computer, a digital photo frame, a navigator, or any other product or component with a display function, which is not limited in the embodiments of the present disclosure.

In the description of the embodiments of the present disclosure, the orientation or position relationship indicated by the terms "middle", "upper", "lower", "front", "rear", "vertical", "horizontal", "top", "bottom", "inner", "outer" and the like is based on the orientation or position relationship shown in the drawings, which is only for the convenience of describing the present disclosure and simplifying the description, rather than indicating or implying that the apparatus or element referred to must have the specific orientation, or be constructed and operated in the specific orientation, and thus cannot be interpreted as a limitation on the present disclosure.

Although the embodiments disclosed in the present disclosure are as described above, the described contents are only the embodiments for facilitating understanding of the present disclosure, which are not intended to limit the present disclosure. A person skilled in the art to which the present disclosure pertains may make any modifications and variations in the form and details of implementation without departing from the spirit and scope of the present disclosure. Nevertheless, the scope of patent protection of the present disclosure shall still be determined by the scope defined by the appended claims.

We claim:

1. A display substrate, comprising: a base substrate, a light emitting structure layer disposed on the base substrate, and a color filter layer disposed on the light emitting structure layer; wherein the base substrate has a display area and a peripheral area located at a periphery of the display area, the display area comprises multiple pixel driving circuits connected with the light emitting structure layer in the display area, and the pixel driving circuit comprises a transistor which comprises an active layer located in an interior of the base substrate; and the color filter layer comprises a transition structure, the transition structure of the color filter layer is located between the display area and the peripheral area, the transition structure comprises at least one color filter unit, a thickness of the at least one color filter unit decreases in a direction from the peripheral area to the display area, and an overlapping area between an orthographic projection of the transition structure of the color filter layer on the base substrate and the display area of the base substrate is not greater than 5% of the display area;

wherein the transition structure comprise: a first color filter unit, a second color filter unit and a third color filter unit which are arranged periodically, and color filter units in each period are arranged in an order of the first color filter unit, the second color filter unit and the third color filter unit in the direction from the peripheral area to the display area;

wherein there is an overlapping area between the orthographic projection of the transition structure on the base substrate and the display area; in the transition structure, the first color filter unit in each period has a slope having a thickness decreasing in the direction from the peripheral area to the display area, and thicknesses of first color filter units in multiple continuous periods in the direction from the peripheral area to the display area decrease continuously.

2. The display substrate according to claim 1, wherein the color filter layer in the display area comprise: a first color filter unit, a second color filter unit and a third color filter unit which are arranged periodically, and color filter units in each period are arranged in an order of the first color filter unit, the second color filter unit and the third color filter unit in the direction from the peripheral area to the display area.

3. The display substrate according to claim 1, wherein in the transition structure, the thicknesses of the first color filter units in multiple continuous periods in the direction from the peripheral area to the display area decreasing continuously comprises: in the transition structure, an average thickness of the first color filter units in multiple continuous periods in the direction from the peripheral area to the display area continuously decreasing, or thicknesses of slopes of the first color filter units in multiple continuous periods in the direction from the peripheral area to the display area continuously decreasing.

4. The display substrate according to claim 1, wherein in the transition structure, an area corresponding to the first color filter unit in each period comprises a suspension area, and the suspension area has a slope having a thickness decreasing in the direction from the peripheral area to the display area.

5. The display substrate according to claim 1, wherein a ratio of an average thickness of the color filter layer in the overlapping area to an average thickness of the color filter layer in the display area other than the overlapping area ranges from 0.8 to 1.5 times, or
a thickness of the color filter layer at a junction between the transition structure and the display area is 0.8 to 1.5 times a thickness of a single-layer color filter unit.

6. The display substrate according to claim 1, an array structure layer being disposed between the base substrate in the display area and the light emitting structure layer; wherein
the array structure layer comprises: a first insulating layer disposed on the base substrate, a reflective electrode disposed on the first insulating layer, and a second insulating layer covering the reflective electrode;
the first insulating layer is provided with a first via exposing a driving transistor of the base substrate, a first conductive pillar is disposed in the first via, the reflective electrode is connected with the driving transistor through the first conductive pillar, the second insulating layer is provided with a second via exposing the reflective electrode, and a second conductive pillar connected with the reflective electrode is disposed in the second via; and
the light emitting structure layer comprises: a first electrode disposed on the second insulating layer, an organic light emitting layer connected with the first electrode, and a second electrode connected with the organic light emitting layer, and the first electrode is connected with the reflective electrode through the second conductive pillar.

7. The display substrate according to claim 6, wherein there is no overlapping area between the orthographic projection of the transition structure on the base substrate and the peripheral area;
the peripheral area comprises: a first non-display area located at the periphery of the display area, and an array structure layer is disposed between the base substrate in the first non-display area and the light emitting structure layer;
the array structure layer in the first non-display area comprises: a first insulating layer disposed on the base substrate and a second insulating layer disposed on the first insulating layer;
the light emitting structure layer in the first non-display area comprises: a first electrode disposed on the second insulating layer, an organic light emitting layer connected with the first electrode, and a second electrode connected with the organic light emitting layer; and
the color filter layer in the first non-display area comprises: multiple color filter units that are stacked, and a thickness of the color filter layer in the first non-display area is greater than a thickness of the transition structure.

8. The display substrate according to claim 1, wherein
the peripheral area comprises a first non-display area located at the periphery of the display area, and there is an overlapping area between the orthographic projection of the transition structure on the base substrate and the first non-display area;
an array structure layer is disposed between the base substrate in the first non-display area and the light emitting structure layer;
the array structure layer in the first non-display area comprises: a first insulating layer disposed on the base substrate and a second insulating layer disposed on the first insulating layer; and
the light emitting structure layer in the first non-display area comprises: a first electrode disposed on the second insulating layer, an organic light emitting layer connected with the first electrode, and a second electrode connected with the organic light emitting layer.

9. The display substrate according to claim 8, wherein
the peripheral area further comprises a second non-display area located at a periphery of the first non-display area, and a boundary of the organic light emitting layer of the light emitting structure layer in the first non-display area is located in the second non-display area; and
the color filter layer in the second non-display area comprises multiple color filter units that are stacked, and a thickness of the color filter layer in the second non-display area is greater than a thickness of the color filter layer in the first non-display area.

10. The display substrate according to claim 9, wherein
the peripheral area further comprises a third non-display area located at a periphery of the second non-display area, and a boundary of the second electrode of the light emitting structure layer in the first non-display area is located in the third non-display area; and
the color filter layer in the third non-display area comprises multiple color filter units that are stacked, and a thickness of the color filter layer in the third non-display area is greater than the thickness of the color filter layer in the first non-display area.

11. A display apparatus, comprising the display substrate according to claim 1.

12. A method for preparing a display substrate, comprising:
 forming a light emitting structure layer on a base substrate, wherein the base substrate has a display area and a peripheral area located at a periphery of the display area, the display area comprises multiple pixel driving circuits connected with the light emitting structure layer in the display area, and the pixel driving circuit comprises a transistor which comprises an active layer located in an interior of the base substrate; and
 forming a color filter layer on the light emitting structure layer, wherein the color filter layer comprises a transition structure, the transition structure of the color filter layer is located between the display area and the peripheral area of the base substrate, the transition structure comprises at least one color filter unit, a thickness of the at least one color filter unit decreases in a direction from the peripheral area to the display area, and an overlapping area between an orthographic projection of the transition structure of the color filter layer on the base substrate and the display area of the base substrate is not greater than 5% of the display area;
 wherein there is an overlapping area between the orthographic projection of the transition structure on the base substrate and the display area; and forming the color filter layer on the light emitting structure layer comprises:
 forming a first color filter unit, a second color filter unit and a third color filter unit, which are arranged periodically, in the transition structure; wherein color filter units in each period are arranged in an order of the first color filter unit, the second color filter unit and the third color filter unit in the direction from the peripheral area to the display area;
 wherein the first color filter unit in each period has a slope having a thickness decreasing in the direction from the peripheral area to the display area, and thicknesses of first color filter units in multiple continuous periods in the direction from the peripheral area to the display area decrease continuously.

13. The method according to claim 12, forming the color filter layer on the light emitting structure layer further comprises:
 forming a first color filter unit, a second color filter unit and a third color filter unit, which are arranged periodically, in the display area; wherein color filter units in each period are arranged in an order of the first color filter unit, the second color filter unit and the third color filter unit in the direction from the peripheral area to the display area.

14. The method according to claim 12, wherein a ratio of an average thickness of the color filter layer in the overlapping area to an average thickness of the color filter layer in the display area other than the overlapping area ranges from 0.8 to 1.5 times, or
 a thickness of the color filter layer at a junction between the transition structure and the display area is 0.8 to 1.5 times a thickness of a single-layer color filter unit.

15. The method according to claim 12, wherein the peripheral area comprises a first non-display area located at the periphery of the display area; forming the color filter layer on the light emitting structure layer comprises:
 sequentially forming a second color filter unit and a third color filter unit in the display area; and
 forming a first color filter unit in the display area and the first non-display area; wherein
 in the display area, color filter units are arranged periodically in an order of the first color filter unit, the second color filter unit and the third color filter unit in the direction from the peripheral area to the display area; and a thickness of the first color filter unit in the first non-display area decreases in the direction from the peripheral area to the display area.

16. The method according to claim 15, wherein before forming the light emitting structure layer in the display area, the method further comprises:
 forming a first insulating layer on the base substrate, the first insulating layer in the display area being formed with a first via exposing a driving transistor of the base substrate;
 forming a first conductive pillar in the first via;
 forming a reflective electrode on the first insulating layer in the display area, the reflective electrode being connected with the driving transistor through the first conductive pillar;
 forming a second insulating layer, the second insulating layer in the display area being formed with a second via exposing the reflective electrode; and
 forming a second conductive pillar in the second via, the second conductive pillar being connected with the reflective electrode;
 wherein forming the light emitting structure layer in the display area and the first non-display area comprises:
 forming a first electrode on the second insulating layer, the first electrode being disposed in the display area and the first non-display area, and the first electrode in the display area being connected with the reflective electrode through the second conductive pillar;
 forming an organic light emitting layer connected with the first electrode in the display area and the first non-display area; and
 forming a second electrode connected with the organic light emitting layer in the display area and the first non-display area.

17. The method according to claim 15, wherein the peripheral area further comprises: a second non-display area located at a periphery of the first non-display area and a third non-display area located at a periphery of the second non-display area;
 wherein forming the color filter layer comprises: forming multiple color filter units, which are stacked, in the second non-display area and the third non-display area, to enable a thickness of the color filter layer in the second non-display area and the third non-display area to be greater than a thickness of the color filter layer in the first non-display area.

18. The method according to claim 12, wherein the thicknesses of the first color filter units in multiple continuous periods in the direction from the peripheral area to the display area decreasing continuously comprises: an average thickness of the first color filter units in multiple continuous periods in the direction from the peripheral area to the display area continuously decreasing, or thicknesses of slopes of the first color filter units in multiple continuous periods in the direction from the peripheral area to the display area continuously decreasing.

* * * * *